United States Patent
Koyama et al.

(10) Patent No.: US 10,847,116 B2
(45) Date of Patent: Nov. 24, 2020

(54) REDUCING PIXEL REFRESH RATE FOR STILL IMAGES USING OXIDE TRANSISTORS

(71) Applicant: Semiconductor Energy Laboratory Co., Ltd., Atsugi (JP)

(72) Inventors: Jun Koyama, Sagamihara (JP); Shunpei Yamazaki, Setagaya (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 469 days.

(21) Appl. No.: 14/016,264

(22) Filed: Sep. 3, 2013

(65) Prior Publication Data

US 2014/0002516 A1 Jan. 2, 2014

Related U.S. Application Data

(63) Continuation of application No. 12/955,078, filed on Nov. 29, 2010, now Pat. No. 8,531,618.

(30) Foreign Application Priority Data

Nov. 30, 2009 (JP) .................................. 2009-272545
Dec. 8, 2009 (JP) .................................. 2009-279003

(51) Int. Cl.
*G09G 5/00* (2006.01)
*G02F 1/1368* (2006.01)
(Continued)

(52) U.S. Cl.
CPC ........... *G09G 5/005* (2013.01); *G02F 1/1368* (2013.01); *G09G 3/3659* (2013.01);
(Continued)

(58) Field of Classification Search
CPC ................. G09G 2330/022; G09G 2300/0842
See application file for complete search history.

(56) References Cited

U.S. PATENT DOCUMENTS 5,514,880 A * 5/1996 Nishimura .............. H01L 27/11
257/350
5,712,652 A 1/1998 Sato et al.
(Continued)

FOREIGN PATENT DOCUMENTS

CN 001400576 A 3/2003
CN 101145327 A 3/2008
(Continued)

OTHER PUBLICATIONS http://www.michaelsharris, Dec. 2007, Digital Logic Intro.*
(Continued)

*Primary Examiner* — Chad M Dicke
(74) *Attorney, Agent, or Firm* — Robinson Intellectual Property Law Office; Eric J. Robinson

(57) ABSTRACT

The liquid crystal display device includes a pixel portion including a plurality of pixels to which image signals are supplied; a driver circuit including a signal line driver circuit which selectively controls a signal line and a gate line driver circuit which selectively controls a gate line; a memory circuit which stores the image signals; a comparison circuit which compares the image signals stored in the memory circuit in the pixels and detects a difference; and a display control circuit which controls the driver circuit and reads the image signal in accordance with the difference. The display control circuit supplies the image signal only to the pixel where the difference is detected. The pixel includes a thin film transistor including a semiconductor layer including an oxide semiconductor.

12 Claims, 19 Drawing Sheets

(51) Int. Cl.
  *G09G 3/36* (2006.01)
  *H01L 27/12* (2006.01)
(52) U.S. Cl.
  CPC ...... *H01L 27/1225* (2013.01); *G02F 2202/10* (2013.01); *G09G 3/3677* (2013.01); *G09G 2320/103* (2013.01); *G09G 2360/10* (2013.01)

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 5,844,535 A * | 12/1998 | Itoh | G09G 3/3659 345/103 |
| 5,982,471 A | 11/1999 | Hirakata et al. | |
| 6,031,514 A | 2/2000 | Hashimoto et al. | |
| 6,278,428 B1 | 8/2001 | Smith et al. | |
| 6,294,274 B1 | 9/2001 | Kawazoe et al. | |
| 6,452,579 B1 | 9/2002 | Itoh et al. | |
| 6,563,174 B2 | 5/2003 | Kawasaki et al. | |
| 6,683,591 B2 | 1/2004 | Hashimoto et al. | |
| 6,727,522 B1 | 4/2004 | Kawasaki et al. | |
| 6,795,066 B2 | 9/2004 | Tanaka et al. | |
| 6,958,744 B2 | 10/2005 | Nakamura | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,123,246 B2 | 10/2006 | Nakatani et al. | |
| 7,211,825 B2 | 5/2007 | Shih et al. | |
| 7,224,339 B2 | 5/2007 | Koyama et al. | |
| 7,282,782 B2 | 10/2007 | Hoffman et al. | |
| 7,286,108 B2 | 10/2007 | Tsuda et al. | |
| 7,297,977 B2 | 11/2007 | Hoffman et al. | |
| 7,321,353 B2 | 1/2008 | Tsuda et al. | |
| 7,323,356 B2 | 1/2008 | Hosono et al. | |
| 7,365,725 B2 | 4/2008 | Nakayoshi et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,688,394 B2 | 3/2010 | Yasui et al. | |
| 7,732,819 B2 | 6/2010 | Akimoto et al. | |
| 7,791,072 B2 | 9/2010 | Kumomi et al. | |
| 7,791,074 B2 | 9/2010 | Iwasaki | |
| 7,807,515 B2 | 10/2010 | Kato et al. | |
| 7,851,792 B2 | 12/2010 | Aiba et al. | |
| 7,910,490 B2 | 3/2011 | Akimoto et al. | |
| 7,932,521 B2 | 4/2011 | Akimoto et al. | |
| 7,935,582 B2 | 5/2011 | Iwasaki | |
| 7,956,361 B2 | 6/2011 | Iwasaki | |
| 7,998,372 B2 | 8/2011 | Yano et al. | |
| 8,110,436 B2 | 2/2012 | Hayashi et al. | |
| 8,154,024 B2 | 4/2012 | Iwasaki | |
| 8,274,077 B2 | 9/2012 | Akimoto et al. | |
| 8,466,463 B2 | 6/2013 | Akimoto et al. | |
| 8,531,618 B2 * | 9/2013 | Koyama | G02F 1/1368 345/87 |
| 8,629,069 B2 | 1/2014 | Akimoto et al. | |
| 8,654,848 B2 | 2/2014 | Tian et al. | |
| 8,669,550 B2 | 3/2014 | Akimoto et al. | |
| 8,790,959 B2 | 7/2014 | Akimoto et al. | |
| 8,796,069 B2 | 8/2014 | Akimoto et al. | |
| 8,828,844 B2 | 9/2014 | Ohnuma et al. | |
| 8,878,757 B2 | 11/2014 | Yoshida et al. | |
| 8,879,635 B2 | 11/2014 | Raveendran et al. | |
| 8,879,856 B2 | 11/2014 | Raveendran et al. | |
| 8,879,857 B2 | 11/2014 | Raveendran et al. | |
| 8,948,260 B2 | 2/2015 | Tian et al. | |
| 9,071,822 B2 | 6/2015 | Raveendran et al. | |
| 9,088,776 B2 | 7/2015 | Raveendran et al. | |
| 9,099,562 B2 | 8/2015 | Akimoto et al. | |
| 9,113,147 B2 | 8/2015 | Raveendran et al. | |
| 9,131,164 B2 | 9/2015 | Tian et al. | |
| 9,159,291 B2 | 10/2015 | Yamazaki et al. | |
| 9,197,912 B2 | 11/2015 | Raveendran et al. | |
| 2001/0046027 A1 | 11/2001 | Tai et al. | |
| 2002/0056838 A1 | 5/2002 | Ogawa | |
| 2002/0084444 A1 * | 7/2002 | Darius | C07C 39/17 252/299.66 |
| 2002/0132454 A1 | 9/2002 | Ohtsu et al. | |
| 2002/0140685 A1 * | 10/2002 | Yamamoto | G09G 3/20 345/204 |
| 2002/0190940 A1 | 12/2002 | Itoh et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2005/0219224 A1 * | 10/2005 | Liebenow | G06F 3/03545 345/173 |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0267889 A1 * | 11/2006 | Kimura | G09G 3/2022 345/84 |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0171280 A1 | 7/2007 | Tian et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0206117 A1 | 9/2007 | Tian et al. | |
| 2007/0222737 A1 | 9/2007 | Kimura | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0055218 A1 | 3/2008 | Tsuda et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |

(56) References Cited

U.S. PATENT DOCUMENTS

| | | |
|---|---|---|
| 2008/0258143 A1 | 10/2008 | Kim et al. |
| 2008/0284970 A1 | 11/2008 | Ishitani |
| 2008/0296568 A1 | 12/2008 | Ryu et al. |
| 2008/0308797 A1 | 12/2008 | Akimoto et al. |
| 2008/0308805 A1 | 12/2008 | Akimoto et al. |
| 2009/0006915 A1 | 1/2009 | Gomez et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0117707 A1 | 5/2009 | Shimomura et al. |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0261325 A1 | 10/2009 | Kawamura et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0194450 A1 | 8/2010 | Shimizu et al. |
| 2010/0295042 A1 | 11/2010 | Yano et al. |
| 2011/0090204 A1 | 4/2011 | Yamazaki et al. |
| 2011/0104851 A1 | 5/2011 | Akimoto et al. |
| 2011/0121290 A1 | 5/2011 | Akimoto et al. |
| 2015/0130857 A1 | 5/2015 | Yoshida et al. |
| 2015/0340513 A1 | 11/2015 | Akimoto et al. |

FOREIGN PATENT DOCUMENTS

| | | |
|---|---|---|
| CN | 101305468 A | 11/2008 |
| EP | 0623911 A | 11/1994 |
| EP | 0 750 288 A | 12/1996 |
| EP | 1280129 A | 1/2003 |
| EP | 1724751 A | 11/2006 |
| EP | 1 737 044 A | 12/2006 |
| EP | 1770788 A | 4/2007 |
| EP | 1921866 A | 5/2008 |
| EP | 1995787 A | 11/2008 |
| EP | 1998373 A | 12/2008 |
| EP | 1998374 A | 12/2008 |
| EP | 1998375 A | 12/2008 |
| EP | 2020686 A | 2/2009 |
| EP | 2048705 A | 4/2009 |
| EP | 2 226 847 A | 9/2010 |
| EP | 2227019 A | 9/2010 |
| EP | 2293539 A | 3/2011 |
| EP | 2293570 A | 3/2011 |
| EP | 2302932 A | 3/2011 |
| EP | 2339639 A | 6/2011 |
| EP | 2945363 A | 11/2015 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 02-210492 A | 8/1990 |
| JP | 03-114030 A | 5/1991 |
| JP | 04-255822 A | 9/1992 |
| JP | 05-224626 A | 9/1993 |
| JP | 05-251705 A | 9/1993 |
| JP | 06-202077 A | 7/1994 |
| JP | 06-313876 A | 11/1994 |
| JP | 08-264794 A | 10/1996 |
| JP | 08-286170 A | 11/1996 |
| JP | 09-005789 A | 1/1997 |
| JP | 09-329807 A | 12/1997 |
| JP | 10-221675 A | 8/1998 |
| JP | 10-240191 A | 9/1998 |
| JP | 11-505377 | 5/1999 |
| JP | 2000-044236 A | 2/2000 |
| JP | 2000-150900 A | 5/2000 |
| JP | 2000-267066 A | 9/2000 |
| JP | 2001-282206 A | 10/2001 |
| JP | 2002-076356 A | 3/2002 |
| JP | 2002-278523 A | 9/2002 |
| JP | 2002-289859 A | 10/2002 |
| JP | 2003-086000 A | 3/2003 |
| JP | 2003-086808 A | 3/2003 |
| JP | 2003-263137 A | 9/2003 |
| JP | 2003-344823 A | 12/2003 |
| JP | 2004-103957 A | 4/2004 |
| JP | 2004-271969 A | 9/2004 |
| JP | 2004-273614 A | 9/2004 |
| JP | 2004-273732 A | 9/2004 |
| JP | 2005-018088 A | 1/2005 |
| JP | 2006-165528 | 6/2006 |
| JP | 2006-189473 A | 7/2006 |
| JP | 2006-350318 A | 12/2006 |
| JP | 2007-103918 A | 4/2007 |
| JP | 2007-123861 A | 5/2007 |
| JP | 2007-142195 A | 6/2007 |
| JP | 2007-179032 A | 7/2007 |
| JP | 2007-194594 A | 8/2007 |
| JP | 2011-141531 A | 7/2011 |
| TW | 200742442 | 11/2007 |
| TW | 200941729 | 10/2009 |
| TW | 200943476 | 10/2009 |
| TW | 200943478 | 10/2009 |
| TW | 200947388 | 11/2009 |
| WO | WO 2004/114391 | 12/2004 |
| WO | WO-2006/070331 | 7/2006 |
| WO | WO-2006/099082 | 9/2006 |
| WO | WO-2007/029844 | 3/2007 |
| WO | WO-2007/038701 | 4/2007 |
| WO | WO-2007/038702 | 4/2007 |
| WO | WO-2007/038724 | 4/2007 |
| WO | WO-2007/038725 | 4/2007 |
| WO | WO-2007/047693 | 4/2007 |
| WO | WO-2007/047755 | 4/2007 |
| WO | WO-2007/047758 | 4/2007 |
| WO | WO-2007/055256 | 5/2007 |
| WO | WO-2007/065041 | 6/2007 |
| WO | WO-2007/114995 | 10/2007 |
| WO | WO-2007/139009 | 12/2007 |
| WO | WO-2009/041713 | 4/2009 |
| WO | WO-2009/066627 | 5/2009 |
| WO | WO-2009/093625 | 7/2009 |
| WO | WO 2011/046032 | 4/2011 |
| WO | WO-2011/065230 | 6/2011 |

OTHER PUBLICATIONS

Taiwanese Office Action (Application No. 099141023) dated Mar. 13, 2015.

Taiwanese Office Action (Application No. 104126099) dated Apr. 21, 2016.

International Search Report (Application No. PCT/JP2010/070064) dated Dec. 21, 2010.

Written Opinion (Application No. PCT/JP2010/070064) dated Dec. 21, 2010.

Fortunato et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

Ikeda et al., "Full-Functional System Liquid Crystal Display Using CG-Silicon Technology," SID Digest '04: SID International Symposium Digest of Technical Papers, 2004, vol. 35, pp. 860-863.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Park et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

(56) References Cited

OTHER PUBLICATIONS

Takahashi et al., "Theoretical Analysis of IGZO Transparent Amorphous Oxide Semiconductor," IDW '08: Proceedings of the 15th International Display Workshops, Dec. 3, 2008, pp. 1637-1640.

Hayashi et al., "42.1: Invited Paper: Improved Amorphous In—Ga—Zn—O TFTs," SID Digest '08: SID International Symposium Digest of Technical Papers, May 20, 2008, vol. 39, pp. 621-624.

Prins et al., "A Ferroelectric Transparent Thin-Film Transistor," Appl. Phys. Lett. (Applied Physics Letters), Jun. 17, 1996, vol. 68, No. 25, pp. 3650-3652.

Nakamura et al., "The Phase Relations in the $In_2O_3$—$Ga_2ZnO_4$—ZnO System at 1350° C.," Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System," Journal of Solid State Chemistry, Apr. 1, 1995, vol. 116, No. 1, pp. 170-178.

Nomura et al., "Thin-Film Transistor Fabricated in Single-Crystalline Transparent Oxide Semiconductor," Science, May 23, 2003, vol. 300, No. 5623, pp. 1269-1272.

Masuda et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Asakuma et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

Osada et al., "15.2: Development of Driver-Integrated Panel using Amorphous In—Ga—Zn-Oxide TFT," SID Digest '09: SID International Symposium Digest of Technical Papers, May 31, 2009, pp. 184-187.

Nomura et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.

Li et al., "Modulated Structures of Homologous Compounds $InMO_3(ZnO)_m$ (M=In,Ga; m=Integer) Described by Four-Dimensional Superspace Group," Journal of Solid State Chemistry, 1998, vol. 139, pp. 347-355.

Son et al., "42.4L: Late-News Paper: 4 Inch QVGA AMOLED Driven by the Threshold Voltage Controlled Amorphous GIZO ($Ga_2O_3$—$In_2O_3$—ZnO) TFT," SID Digest '08: SID International Symposium Digest of Technical Papers, May 20, 2008, vol. 39, pp. 633-636.

Lee et al., "World's Largest (15-inch) XGA AMLCD Panel Using IGZO Oxide TFT," SID Digest '08: SID International Symposium Digest of Technical Papers, May 20, 2008, vol. 39, pp. 625-628.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Kanno et al., "White Stacked Electrophosphorecent Organic Light-Emitting Devices Employing $MoO_3$ as a Charge-Generation Layer," Adv. Mater. (Advanced Materials), 2006, vol. 18, No. 3, pp. 339-342.

Tsuda et al., "Ultra Low Power Consumption Technologies for Mobile TFT-LCDs," IDW '02: Proceedings of the 9th International Display Workshops, Dec. 4, 2002, pp. 295-298.

Van de Walle, "Hydrogen as a Cause of Doping in Zinc Oxide," Phys. Rev. Lett. (Physical Review Letters), Jul. 31, 2000, vol. 85, No. 5, pp. 1012-1015.

Fung et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Jeong et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.

Park et al., "High performance amorphous oxide thin film transistors with self-aligned top-gate structure," IEDM 09: Technical Digest of International Electron Devices Meeting, Dec. 7, 2009, pp. 191-194.

Kurokawa et al., "UHF RFCPUs on Flexible and Glass Substrates for Secure RFID Systems," Journal of Solid-State Circuits, 2008, vol. 43, No. 1, pp. 292-299.

Ohara et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Coates et al., "Optical Studies of the Amorphous Liquid—Cholesteric Liquid Crystal Transition: The "Blue Phase"," Physics Letters, Sep. 10, 1973, vol. 45A, No. 2, pp. 115-116.

Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.

Lee et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Sakata et al., "Development of 4.0-In. AMOLED Display with Driver Circuit Using Amorphous In—Ga—Zn-Oxide TFTs," IDW '09: Proceedings of the 16th International Display Workshops, 2009, pp. 689-692.

Park et al., "Amorphous Indium-Gallium-Zinc Oxide TFTs and their Application for Large Size AMOLED," AM-FPD '08 Digest of Technical Papers, Jul. 2, 2008, pp. 275-278.

Park et al., "Challenge to Future Displays: Transparent AM-OLED Driven by PEALD Grown ZnO TFT," IMID '07 Digest, 2007, pp. 1249-1252.

Godo et al., "Temperature Dependence of Characteristics and Electronic Structure for Amorphous In—Ga—Zn-Oxide TFT," AM-FPD '09 Digest of Technical Papers, Jul. 1, 2009, pp. 41-44.

Osada et al., "Development of Driver-Integrated Panel using Amorphous In—Ga—Zn-Oxide TFT," AM-FPD '09 Digest of Technical Papers, Jul. 1, 2009, pp. 33-36.

Hirao et al., "Novel Top-Gate Zinc Oxide Thin-Film Transistors (ZnO TFTs) for AMLCDs," Journal of the SID, 2007, vol. 15, No. 1, pp. 17-22.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Godo et al., "P-9: Numerical Analysis on Temperature Dependence of Characteristics of Amorphous In—Ga—Zn-Oxide TFT," SID Digest '09: SID International Symposium Digest of Technical Papers, May 31, 2009, pp. 1110-1112.

Ohara et al., "21.3: 4.0 In. QVGA AMOLED Display Using In—Ga—Zn-Oxide TFTs with a Novel Passivation Layer," SID Digest '09: SID International Symposium Digest of Technical Papers, May 31, 2009, pp. 284-287.

Miyasaka, "Suftla Flexible Microelectronics on their Way to Business," SID Digest '07: SID International Symposium Digest of Technical Papers, 2007, vol. 38, pp. 1673-1676.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Asaoka et al., "29.1: Polarizer-Free Reflective LCD Combined With Ultra Low-Power Driving Technology," SID Digest '09: SID International Symposium Digest of Technical Papers, May 31, 2009, pp. 395-398.

(56) References Cited

OTHER PUBLICATIONS

Lee et al., "Current Status of, Challenges to, and Perspective View of AM-OLED," IDW '06: Proceedings of the 13$^{th}$ International Display Workshops, Dec. 7, 2006, pp. 663-666.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Nakamura, "Synthesis of Homologous Compound with New Long-Period Structure," NIRIM Newsletter, Mar. 1, 1995, vol. 150, pp. 1-4.

Kikuchi et al., "Polymer-Stabilized Liquid Crystal Blue Phases," Nature Materials, Sep. 2, 2002, vol. 1, pp. 64-68.

Kimizuka et al., "Spinel, YbFe$_2$O$_4$, and Yb$_2$Fe$_3$O$_7$ Types of Structures for Compounds in the In$_2$O$_3$ and Sc$_2$O$_3$—A$_2$O$_3$—BO Systems [A: Fe, Ga, or Al; B: Mg, Mn, Fe, Ni, Cu, or Zn] at Temperatures Over 1000° C.," Journal of Solid State Chemistry, 1985, vol. 60, pp. 382-384.

Kitzerow et al., "Observation of Blue Phases in Chiral Networks," Liquid Crystals, 1993, vol. 14, No. 3, pp. 911-916.

Costello et al., "Electron Microscopy of a Cholesteric Liquid Crystal and its Blue Phase," Phys. Rev. A (Physical Review A), May 1, 1984, vol. 29, No. 5, pp. 2957-2959.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Park et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Orita et al., "Mechanism of Electrical Conductivity of Transparent InGaZnO$_4$," Phys. Rev. B (Physical Review B), Jan. 15, 2000, vol. 61, No. 3, pp. 1811-1816.

Nomura et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Janotti et al., "Native Point Defects in ZnO," Phys. Rev. B (Physical Review. B), Oct. 4, 2007, vol. 76, No. 16, pp. 165202-1-165202-22.

Park et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Hsieh et al., "P-29: Modeling of Amorphous Oxide Semiconductor Thin Film Transistors and Subgap Density of States," SID Digest '08: SID Digest '08: SID International Symposium Digest of Technical Papers, 2008, vol. 39, pp. 1277-1280.

Janotti et al., "Oxygen Vacancies in ZnO," Appl. Phys. Lett. (Applied Physics Letters), 2005, vol. 87, pp. 122102-1-122102-3.

Oba et al., "Defect energetics in ZnO: A hybrid Hartree-Fock density functional study," Phys. Rev. B (Physical Review B), 2008, vol. 77, pp. 245202-1-245202-6.

Orita et al., "Amorphous transparent conductive oxide InGaO$_3$(ZnO)$_m$ (m<4): a Zn 4s conductor," Philosophical Magazine, 2001, vol. 81, No. 5, pp. 501-515.

Hosono et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Mo et al., "Amorphous Oxide TFT Backplanes for Large Size AMOLED Displays," IDW '08: Proceedings of the 6$^{th}$ International Display Workshops, Dec. 3, 2008, pp. 581-584.

Kim et al., "High-Performance oxide thin film transistors passivated by various gas plasmas," 214$^{th}$ ECS Meeting, 2008, No. 2317, ECS.

Clark et al., "First Principles Methods Using CASTEP," Zeitschrift fur Kristallographie, 2005, vol. 220, pp. 567-570.

Lany et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Park et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Oh et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.

Ueno et al., "Field-Effect Transistor on SrTiO$_3$ with Sputtered Al$_2$O$_3$ Gate Insulator," Appl. Phys. Lett. (Applied Physics Letters), Sep. 1, 2003, vol. 83, No. 9, pp. 1755-1757.

European Search Report (Application No. 10833077.0) dated Jun. 13, 2013.

U.S. Pat. No. 7,791,072 is in the family of JP 2006-165528.

U.S. Pat. No. 5,844,535 is in the family of EP 0 750 288.

U.S. Pat. Nos. 6,727,522 and 7,064,346 are in the family of JP 2000-150900.

U.S. Pat. No. 7,061,014 is in the family of JP 2004-103957.

U.S. Pat. No. 5,744,864 is in the family of JP 11-505377.

U.S. Pat. No. 6,563,174 is in the family of JP 2003-086808.

U.S. Publication No. 2006/0244107 is in the family of WO 2004/114391.

U.S. Publication No. 2011/0090204 is in the family of WO 2011/046032.

U.S. Pat. No. 6,452,579, is in the family of U.S. Publication No. 2002/0190940.

Chinese Office Action (Application No. 201610319319.X) dated Jul. 20, 2018.

\* cited by examiner

REDUCING PIXEL REFRESH RATE FOR STILL IMAGES USING OXIDE TRANSISTORS

TECHNICAL FIELD

The present invention relates to liquid crystal display devices. Further, the present invention relates to a method for driving liquid crystal display devices. Furthermore, the present invention relates to electronic devices including the liquid crystal display devices.

BACKGROUND ART

A thin film transistor formed over a flat plate such as a glass substrate is formed using amorphous silicon or polycrystalline silicon, as typically seen in a liquid crystal display device. Although a thin film transistor including amorphous silicon has low field effect mobility, it can be formed over a larger glass substrate. In contrast, although a thin film transistor including polycrystalline silicon has high field effect mobility, it needs a crystallization process such as laser annealing and the threshold voltage greatly varies, so that such a transistor is not always suitable for a larger glass substrate.

In contrast, attention has been drawn to a technique by which a thin film transistor is formed using an oxide semiconductor and is applied to an electronic device or an optical device has attracted attention. For example, Reference 1 discloses a technique by which a thin film transistor is formed using zinc oxide or an In—Ga—Zn—O-based oxide semiconductor for an oxide semiconductor film and is used as a switching element or the like in a liquid crystal display device.

REFERENCE

[Reference 1] Japanese Published Patent Application No. 2006-165528

DISCLOSURE OF INVENTION

A thin film transistor including an oxide semiconductor in a channel region has higher field effect mobility than a thin film transistor including amorphous silicon in a channel region. A pixel including such a thin film transistor formed using an oxide semiconductor is expected to be applied to a display device such as a liquid crystal display device.

In each pixel included in a liquid crystal display device, a storage capacitor for holding the potentials of opposite electrodes which holds a liquid crystal material for a certain period is provided in part of the region of the pixel in order to control the alignment of a liquid crystal element. In order to hold the potentials of the opposite electrodes which holds the liquid crystal material, it is necessary to reduce leakage of electric charge from the opposite electrodes which holds the liquid crystal material. It is important to reduce the off-state current of a thin film transistor connected to a pixel electrode provided in each pixel.

In addition, when a still image is displayed or a moving image part of which is a still image (such an image is also referred to as a partial moving image) is displayed, even when image signals in a series of periods are the same, operation for rewriting the image signals into the same image signals as image signals which have already been rewritten is necessary. Accordingly, even when the image signals in the series of periods are the same, power consumption increases due to rewrite operation of image signals plural times. In this case, even if power consumption is to be reduced by the decrease in the frequency of rewrites of image signals, it is difficult to hold the images signals in pixels due to the increase in off-state current or the like. Thus, there is concern that display quality will decrease.

Note that in this specification, off-state current is current which flows between a source and a drain when a thin film transistor is off (non-conducting). In the case of an n-channel thin film transistor (for example, with a threshold voltage of about 0 to 2 V), off-state current is current which flows between a source and a drain when negative voltage is applied between a gate and the source.

In view of the foregoing problems, it is an object of one embodiment of the present invention to reduce the off-state current of a thin film transistor and the power consumption of a liquid crystal display device capable of displaying moving images and still images.

One embodiment of the present invention is a liquid crystal display device including a pixel portion including a plurality of pixels to which image signals are supplied; a driver circuit including a signal line driver circuit which selectively controls a signal line and a gate line driver circuit which selectively controls a gate line; a memory circuit which stores the image signals; a comparison circuit which compares the image signals stored in the memory circuit in the pixels and calculates a difference; and a display control circuit which controls the driver circuit and reads the image signal in accordance with the difference. The display control circuit supplies the image signal only to the pixel where the difference is detected. The pixel includes a thin film transistor. A gate of the thin film transistor is electrically connected to the gate line; a first terminal of the thin film transistor is electrically connected to the signal line; and a second terminal of the thin film transistor is electrically connected to a pixel electrode. The thin film transistor includes a semiconductor layer including an oxide semiconductor.

One embodiment of the present invention is a liquid crystal display device including a pixel portion including a plurality of pixels to which image signals are supplied; a driver circuit including a signal line driver circuit which selectively controls a signal line and a selection line and a gate line driver circuit which selectively controls a gate line with decoder circuits; a memory circuit which stores the image signals; a comparison circuit which compares the image signals stored in the memory circuit in the pixels and calculates a difference; and a display control circuit which controls the driver circuit and reads the image signal in accordance with the difference. The display control circuit supplies the image signal only to the pixel where the difference is detected by control of the decoder circuit. The pixel includes a first thin film transistor and a second thin film transistor. A gate of the first thin film transistor is electrically connected to the gate line; a first terminal of the first thin film transistor is electrically connected to the signal line; and a second terminal of the first thin film transistor is electrically connected to a first terminal of the second thin film transistor. A gate of the second thin film transistor is electrically connected to the selection line, and a second terminal of the second thin film transistor is electrically connected to a pixel electrode. The first thin film transistor and the second thin film transistor each include a semiconductor layer including an oxide semiconductor.

One embodiment of the present invention is a liquid crystal display device including a pixel portion including a plurality of pixels to which image signals are supplied; a driver circuit including a signal line driver circuit which selectively controls a signal line with a shift register circuit and a gate line driver circuit which selectively controls a gate line with a decoder circuit; a memory circuit which stores the image signals; a comparison circuit which compares the image signals stored in the memory circuit in the pixels and calculates a difference; and a display control circuit which controls the driver circuit and reads the image signal in accordance with the difference. The display control circuit supplies the image signal to the pixel where the difference is detected by control of the decoder circuit. The pixel includes a thin film transistor. A gate of the thin film transistor is electrically connected to the gate line; a first terminal of the thin film transistor is electrically connected to the signal line; and a second terminal of the thin film transistor is electrically connected to a pixel electrode. The thin film transistor includes a semiconductor layer including an oxide semiconductor.

In one embodiment of the present invention, the concentration of hydrogen in the oxide semiconductor in the liquid crystal display device that is measured by secondary ion mass spectroscopy may be $1 \times 10^{16}/cm^3$ or lower.

In one embodiment of the present invention, the carrier concentration of the oxide semiconductor in the liquid crystal display device may be lower than $1 \times 10^{14}/cm^3$.

In one embodiment of the present invention, the liquid crystal display device may have the following structure: the pixel portion includes the pixel electrode in each pixel and is provided over a first substrate together with a terminal portion and a switching transistor; a counter electrode is provided on a second substrate; a liquid crystal is held between the pixel electrode and the counter electrode; the counter electrode is electrically connected to the terminal portion through the switching transistor; and a semiconductor layer included in the switching transistor is formed using an oxide semiconductor.

One embodiment of the present invention is a method for driving a liquid crystal display device including a pixel portion including a plurality of pixels to which image signals are supplied and which are provided with thin film transistors including semiconductor layers formed using oxide semiconductor, a driver circuit including a signal line driver circuit and a gate line driver circuit, a memory circuit which stores the image signals, a comparison circuit which compares the image signals stored in the memory circuit in the pixels and calculates a difference, and a display control circuit which controls the driver circuit and reads the image signal. The method includes a step of reading and comparing image signals in a series of frame periods that are stored in the memory circuit in the pixels and calculating a difference in the comparison circuit and a step of controlling the driver circuit so that the display control circuit supplies the image signal only to the pixel where the difference is detected in the comparison circuit.

According to one embodiment of the present invention, the off-state current of a thin film transistor including an oxide semiconductor can be reduced, and power consumed in displaying moving images, still images, or the like can be reduced without the decrease in display quality.

BEST MODE FOR CARRYING OUT THE INVENTION

Figure 1:
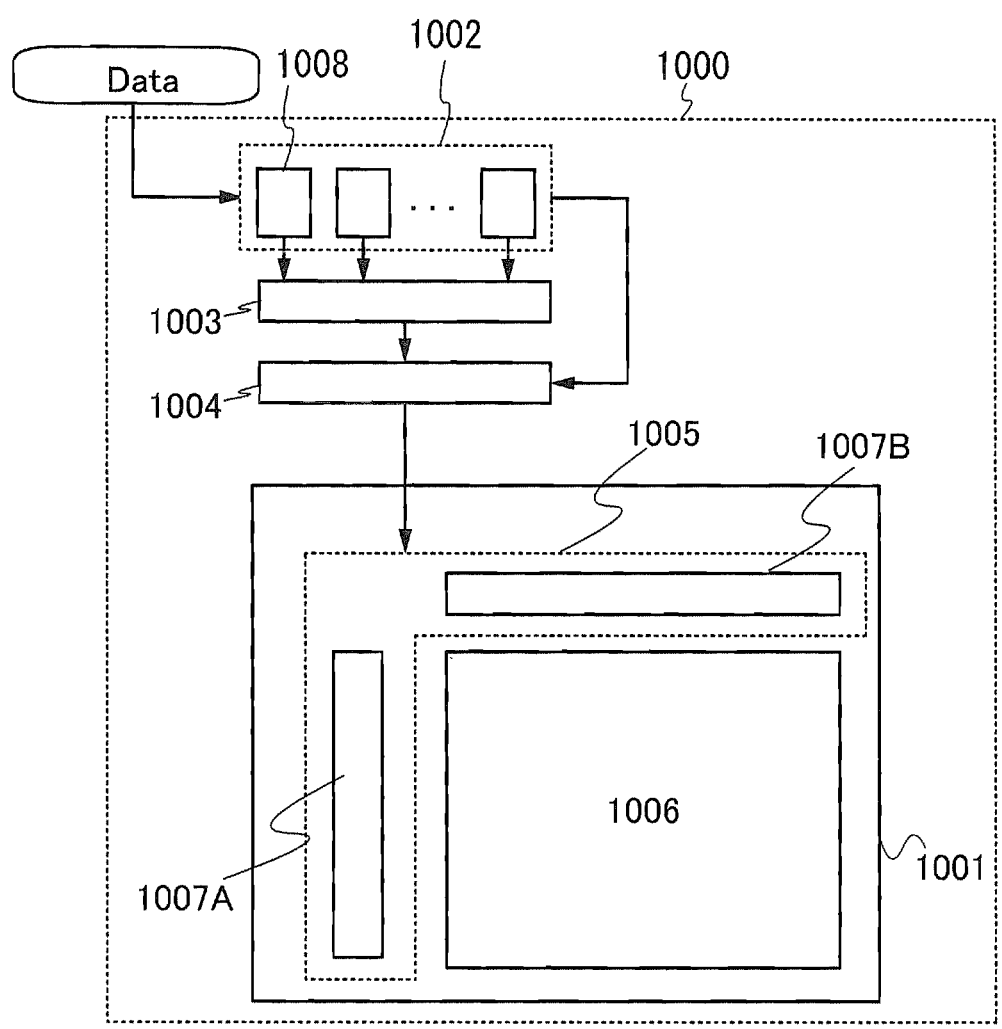
FIG. 1 illustrates a liquid crystal display device in one embodiment of the present invention.

Embodiments of the present invention will be described below with reference to the drawings. Note that the present invention can be implemented in various different ways and it will be readily appreciated by those skilled in the art that modes and details of the present invention can be changed in various ways without departing from the spirit and scope of the present invention. Therefore, the present invention should not be construed as being limited to the following description of the embodiments. Note that in structures of the present invention described below, reference numerals denoting the same portions are used in common in different drawings.

Note that the size, the layer thickness, or the region of each component illustrated in drawings and the like in embodiments is exaggerated for clarity in some cases. Therefore, embodiments of the present invention are not limited to such scales.

Note that in this specification, terms such as "first", "second", "third", and "N-th" (N is a natural number) are used in order to avoid confusion among components and do not limit the number.

Embodiment 1

In this embodiment, a block diagram of a liquid crystal display device and a procedure for determining a moving image, a still image, and a partial moving image are described. First, FIG. 1 illustrates the block diagram of the liquid crystal display device.

A liquid crystal display device 1000 illustrated in FIG. 1 includes a display panel 1001, a memory circuit 1002, a comparison circuit 1003, and a display control circuit 1004. An image signal Data which is supplied to each pixel is input from the outside.

The display panel 1001 includes, for example, a driver circuit portion 1005 and a pixel portion 1006.

The driver circuit portion 1005 includes a gate line driver circuit 1007A and a signal line driver circuit 1007B. The gate line driver circuit 1007A and the signal line driver circuit 1007B are driver circuits for selectively driving a plurality of pixels included in the pixel portion 1006. Specifically, the driver circuit portion 1005 includes a signal line driver circuit which selectively controls signal lines and a gate line driver circuit which selectively controls gate lines. For example, decoder circuits may be used as the gate line driver circuit 1007A and the signal line driver circuit 1007B. Alternatively, a decoder circuit may be used as the gate line driver circuit 1007A and a shift register circuit may be used as the signal line driver circuit 1007B.

Note that the gate line driver circuit 1007A, the signal line driver circuit 1007B, and the pixel portion 1006 may be formed using thin film transistors formed over one substrate. Alternatively, the gate line driver circuit 1007A and the signal line driver circuit 1007B, and the pixel portion 1006 may be formed over different substrates.

Note that as a thin film transistor provided in each pixel of the pixel portion 1006, an n-channel thin film transistor whose semiconductor layer is formed using an oxide semiconductor is used. An oxide semiconductor used for the semiconductor layer of the thin film transistor included in the pixel portion 1006 and a thin film transistor whose semiconductor layer is formed using an oxide semiconductor are described.

Note that as the display method of a pixel circuit, a progressive method, an interlace method, or the like can be employed. Further, color elements controlled in a pixel at the time of color display are not limited to three colors: R, G, and B (R, G, and B correspond to red, greed, and blue, respectively). For example, R, G, B, and W (W corresponds to white); R, G, B, and one or more of yellow, cyan, magenta, and the like; or the like can be used. Note that the size of display regions may be different between dots of color elements. However, one embodiment of the present invention is not limited to a color liquid crystal display device and can be applied to a monochrome liquid crystal display device.

As the oxide semiconductor, an oxide semiconductor such as In—Sn—Ga—Zn—O, In—Ga—Zn—O, In—Sn—Zn—O, In—Al—Zn—O, Sn—Ga—Zn—O, Al—Ga—Zn—O, Sn—Al—Zn—O, In—Zn—O, Sn—Zn—O, Al—Zn—O, Zn—Mg—O, Sn—Mg—O, In—Mg—O, In—O, Sn—O, or Zn—O can be used. Further, Si may be contained in the oxide semiconductor.

As the oxide semiconductor, a thin film expressed by $InMO_3(ZnO)_m$ (m>0) can be used. Here, M denotes one or more metal elements selected from Ga, Al, Mn, or Co. For example, M can be Ga, Ga and Al, Ga and Mn, Ga and Co, or the like. Among oxide semiconductor films whose composition formulae are expressed by $InMO_3(ZnO)_m$ (m>0), an oxide semiconductor which includes Ga as M is referred to as an In—Ga—Zn—O-based oxide semiconductor, and a thin film of the In—Ga—Zn—O-based oxide semiconductor is also referred to as an In—Ga—Zn—O-based film.

Figure 12:
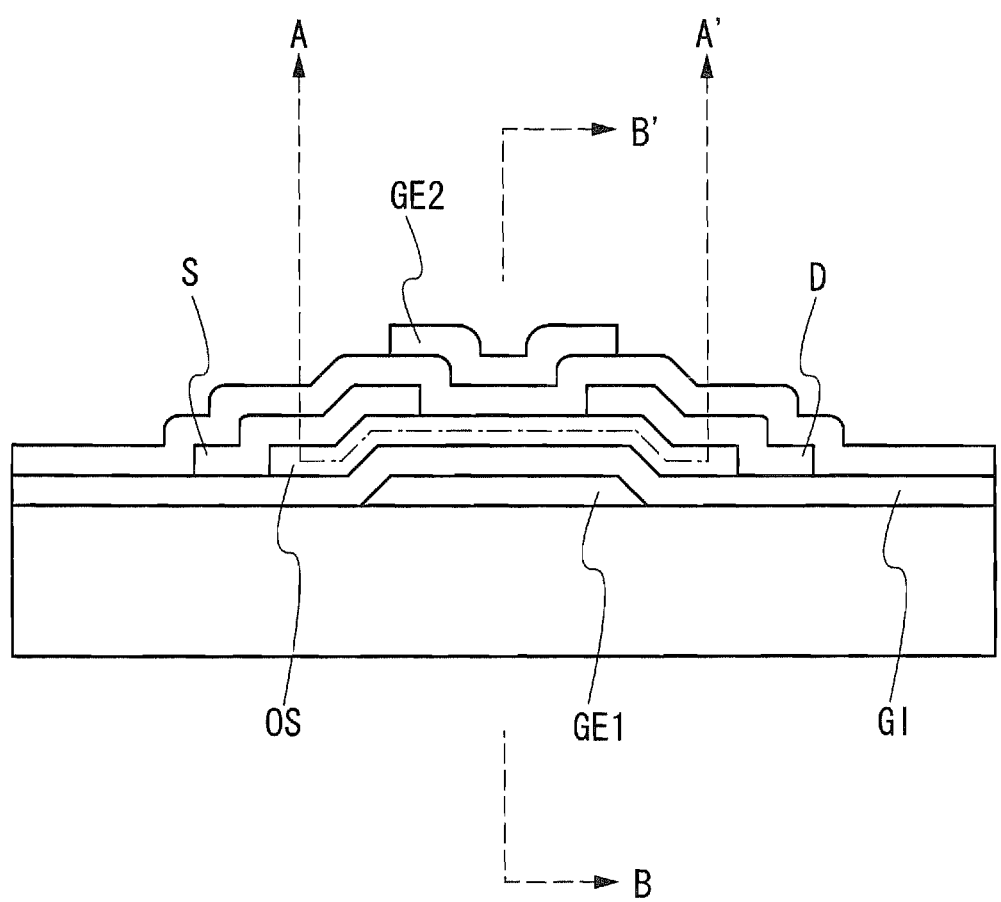
FIG. 12 is a longitudinal cross-sectional view of an inverted staggered thin film transistor including an oxide semiconductor.

FIG. 12 is a longitudinal cross-sectional view of an inverted staggered thin film transistor including an oxide semiconductor. An oxide semiconductor layer (OS) is provided over a gate electrode (GE1) with a gate insulating film (GI) provided therebetween. A source electrode (S) and a drain electrode (D) are provided thereover.

Figure 13A:
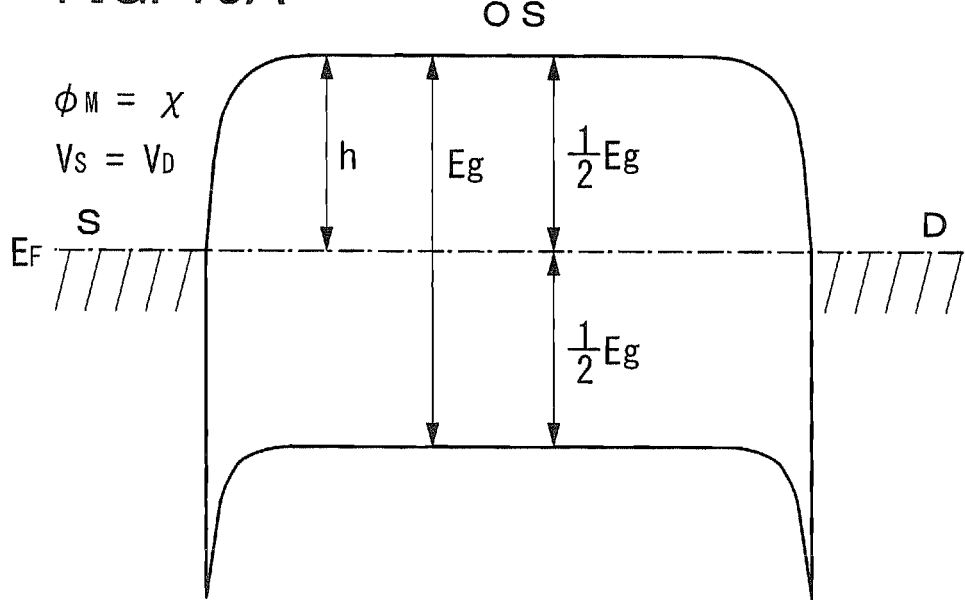
FIGS. 13A and 13B are energy band diagrams (schematic diagrams) in an A-A' cross section in FIG. 12.
Figure 13B:
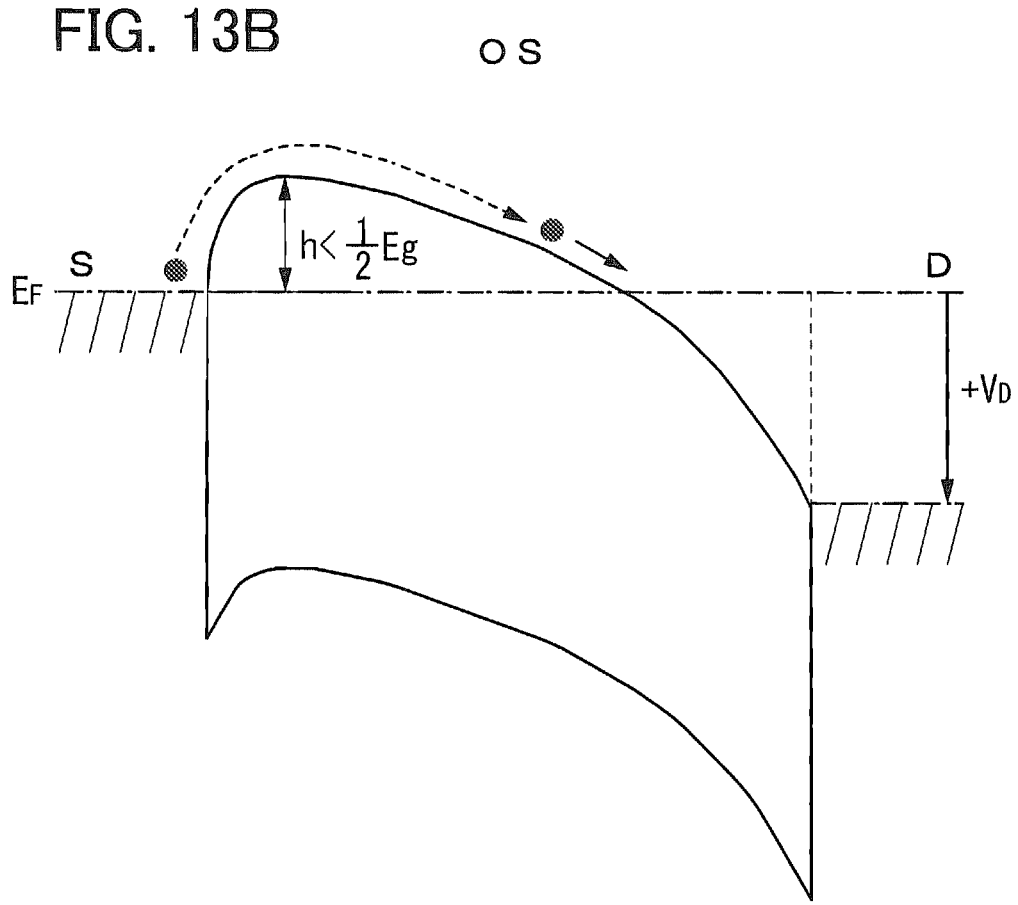

FIGS. 13A and 13B are energy band diagrams (schematic diagrams) in an A-A' cross section in FIG. 12. FIG. 13A illustrates the case where the voltage of a source and the voltage of a drain are equal ($V_D=0$ V), and FIG. 13B illustrates the case where a positive potential ($V_D>0$ V) is applied to the drain.

Figure 14A:
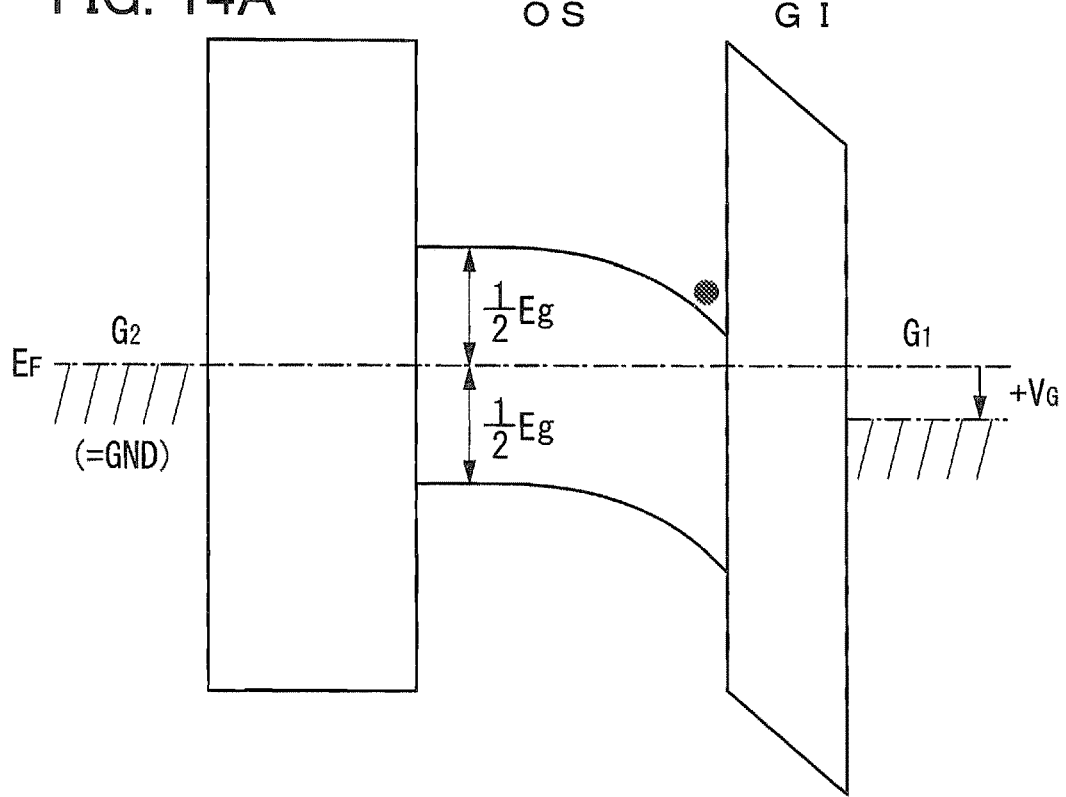
FIG. 14A is an energy band diagram (a schematic diagram) illustrating a state in which a positive potential ($+V_G$) is applied to a gate (G1)
Figure 14B:
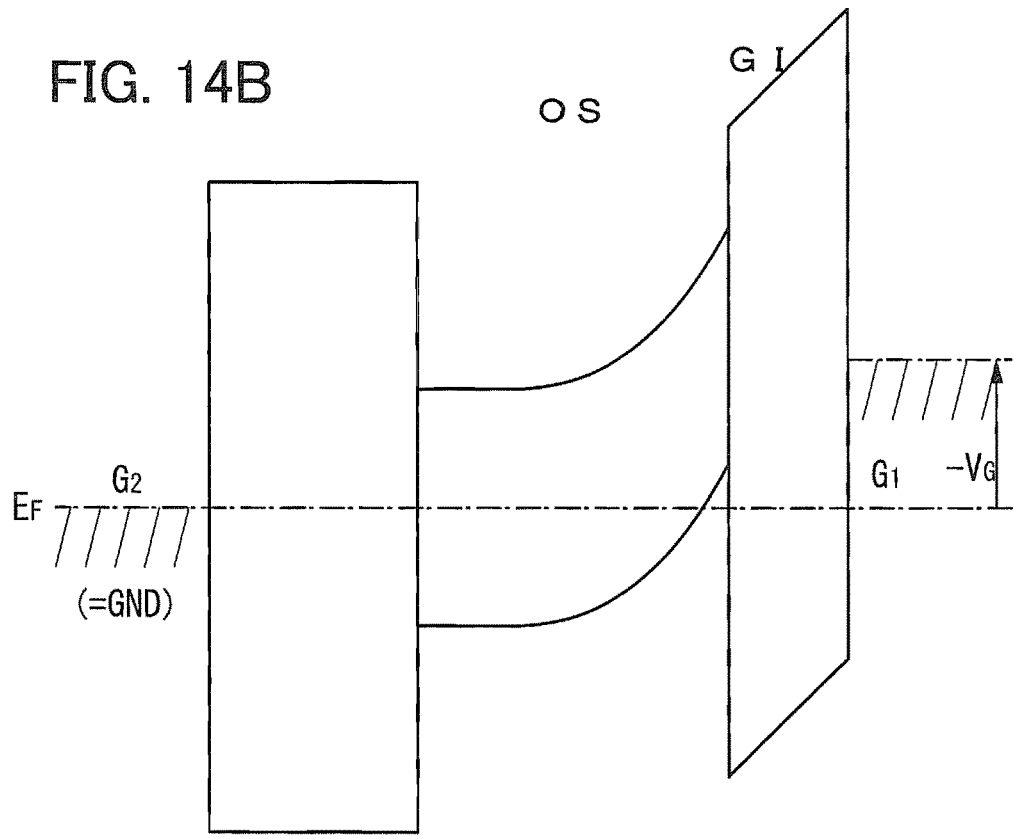
FIG. 14B is an energy band diagram (a schematic diagram) illustrating a state in which a negative potential ($-V_G$) is applied to the gate (G1)

FIGS. 14A and 14B are energy band diagrams (schematic diagrams) in a B-B' cross section in FIG. 12. FIG. 14A illustrates a state in which a positive potential ($+V_G$) is applied to a gate (G1) and a carrier (an electron) flows between the source and the drain. Further, FIG. 14B illustrates a state in which a negative potential ($-V_G$) is applied to the gate (G1) and the thin film transistor is off (minority carriers do not flow). Note that in FIGS. 14A and 14B, a GND potential is applied to a gate (G2).

Figure 15:
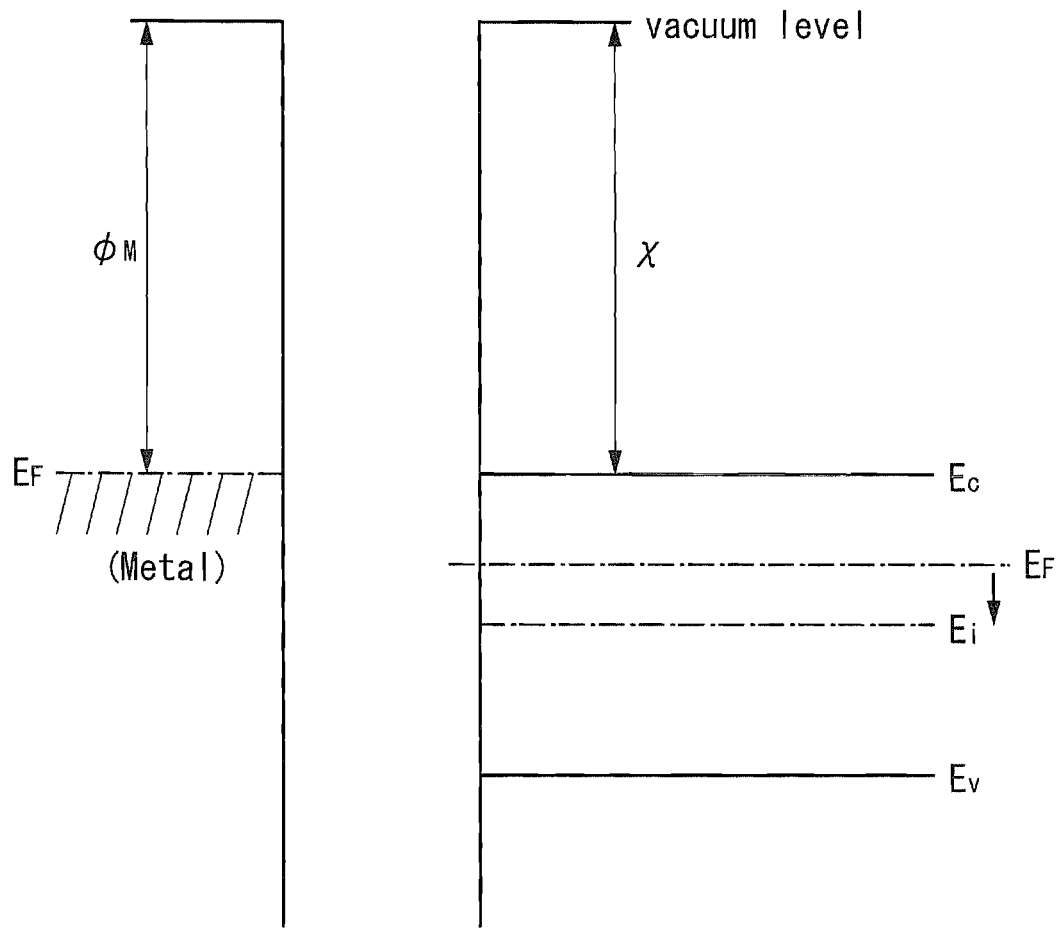
FIG. 15 illustrates a relationship among a vacuum level, a work function ($\phi_M$) of a metal, and electron affinity ($\chi$) of an oxide semiconductor.

FIG. 15 illustrates a relationship between a vacuum level, the work function ($\phi_M$) of a metal, and the electron affinity ($\chi$) of an oxide semiconductor.

A conventional oxide semiconductor generally has n-type conductivity, and the Fermi level ($E_F$) in that case is apart from the intrinsic Fermi level ($E_i$) positioned in the middle of the band gap and is positioned near the conduction band. Note that it is known that part of hydrogen in an oxide semiconductor serves as a donor and is a factor which makes the oxide semiconductor have n-type conductivity.

In contrast, an oxide semiconductor of the present invention is an intrinsic (i-type) or substantially intrinsic oxide semiconductor obtained by removal of hydrogen, which is an n-type impurity, from the oxide semiconductor and by the increase in purity so that an impurity other than the main components of the oxide semiconductor is not included as much as possible. In other words, the oxide semiconductor is a highly purified intrinsic (i-type) semiconductor or a semiconductor which is close to a highly purified intrinsic semiconductor not by addition of an impurity but by removal of an impurity such as hydrogen or water as much as possible. In this manner, the Fermi level ($E_F$) can be equal to the intrinsic Fermi level ($E_i$).

It is said that in the case where the band gap ($E_g$) of the oxide semiconductor is 3.15 eV, electron affinity ($\chi$) is 4.3 eV. The work function of titanium (Ti) used for the source electrode and the drain electrode is substantially equal to the electron affinity ($\chi$) of the oxide semiconductor. In this case, the Schottky electron barrier is not formed at an interface between the metal and the oxide semiconductor.

In other words, in the case where the work function ($\phi_M$) of the metal is equal to the electron affinity ($\chi$) of the oxide semiconductor and the metal and the oxide semiconductor are in contact with each other, an energy band diagram (a schematic diagram) like that in FIG. 13A is obtained.

In FIG. 13B, a black circle (●) indicates an electron. When positive voltage is applied to the drain, the electron is injected into the oxide semiconductor over a barrier (h) and flows toward the drain. In that case, the height of the barrier (h) changes depending on gate voltage and drain voltage; in the case where positive drain voltage is applied, the height of the barrier (h) is smaller than the height of the barrier in FIG. 13A where no voltage is applied, i.e., half of the band gap ($E_g$).

In this case, as illustrated in FIG. 14A, the electron moves along the lowest part that is energetically stable on the oxide semiconductor side at an interface between the gate insulating film and the highly purified oxide semiconductor.

Further, in FIG. 14B, when a negative potential is applied to the gate (G1), the amount of current is extremely close to zero because the number of holes that are minority carriers is substantially zero.

For example, even when the thin film transistor has a channel width W of $1\times10^4$ μm and a channel length L of 3 μm, an off-state current of $10^{-13}$ A or less and a subthreshold swing (an S value) of 0.1 V/dec (the thickness of the gate insulating film is 100 nm) can be obtained.

By the increase in purity so that an impurity other than the main components of the oxide semiconductor is not included as much as possible in this manner, the thin film transistor can operate favorably.

In order to prevent variation in electrical characteristics of the oxide semiconductor of the present invention, an impurity that causes the variation, such as hydrogen, moisture, a hydroxyl group, or hydride (also referred to as a hydrogen compound), is intentionally removed from the oxide semiconductor layer. Additionally, the oxide semiconductor layer becomes a highly purified electrically i-type (intrinsic) oxide semiconductor layer by supply of oxygen which is a component of the oxide semiconductor that is simultaneously reduced in a step of removing the impurity.

Therefore, it is preferable that the amount of hydrogen in the oxide semiconductor be as small as possible. It is preferable that the amount of hydrogen in the oxide semiconductor be $1\times10^{16}$/cm$^3$ or less, and hydrogen contained in the oxide semiconductor is removed as much as possible so as to be as close to zero as possible. Note that the concentration of hydrogen in the oxide semiconductor may be measured by secondary ion mass spectroscopy (SIMS).

Further, the number of carriers in the highly purified oxide semiconductor is significantly small (close to zero), and the carrier concentration of the oxide semiconductor layer is lower than $1\times10^{14}$/cm$^3$, preferably $1\times10^{12}$/cm$^3$ or lower. That is, the carrier concentration of the oxide semiconductor layer is as close to zero as possible. Since the number of carriers in the oxide semiconductor is significantly small, the off-state current of the thin film transistor can be reduced. It is preferable that the off-state current be as low as possible. The amount of current per micrometer of channel width (W) in the thin film transistor is 100 aA/μm or less, preferably 10 aA/μm or less, more preferably 1 aA/μm or less.

Here, the case where the number of carriers is significantly small (substantially zero) and the off-state current is significantly low in the highly purified oxide semiconductor is described in detail with reference to numerical formulae and measurement data.

If the Fermi-Dirac distribution holds true, $E_g$ of the highly purified oxide semiconductor is 3.05 to 3.15 eV; thus, the number of intrinsic carriers is much smaller than that of Si (also referred to as silicon). Further, the intrinsic carrier density $n_i$ of Si is approximately $10^{10}$ cm$^{-3}$, and the intrinsic carrier density $n_i$ of the highly purified oxide semiconductor is approximately $10^{-7}$ cm$^{-3}$. In other words, the difference between the intrinsic carrier density $n_i$ of Si and the intrinsic carrier density n, of the highly purified oxide semiconductor is about a 17-digit difference, and it is found that the intrinsic carrier density $n_i$ of the highly purified oxide semiconductor is much lower than that of silicon.

The intrinsic carrier concentration of the highly purified oxide semiconductor can be easily estimated.

It is known that the energy distribution f of an electron in a solid is based on the Fermi-Dirac statistics expressed as Numerical Formula 1.

$$f(E) = \frac{1}{1 + \exp\left(\frac{E - E_F}{kT}\right)} \quad \text{[Numerical Formula 1]}$$

The Fermi-Dirac distribution of a normal semiconductor which has not so high carrier density, i.e, a normal semiconductor which does not degenerate can be approximated by the following numerical formula.

$$|E - E_F| > kT \quad \text{[Numerical Formula 2]}$$

Therefore, the Fermi-Dirac distribution expressed as Numerical Formula 1 can be approximated by the formula of the Boltzmann distribution expressed as Numerical Formula 3.

$$f(E) = \exp\left[-\frac{E - E_F}{kT}\right] \quad \text{[Numerical Formula 3]}$$

When the intrinsic carrier density ($n_i$) of the semiconductor is calculated using Numerical Formula 3, Numerical Formula 4 is obtained.

$$n_i = \sqrt{N_C N_V} \exp\left(-\frac{E_g}{2kT}\right) \quad \text{[Numerical Formula 4]}$$

The intrinsic carrier density was calculated by substitution of the values of effective density of states (Nc and Nv) and band gaps ($E_g$) in the conduction band and the valence band of Si disclosed in the reference and In—Ga—Zn—O (hereinafter abbreviated as IGZO) into Numerical Formula 4. Table 1 shows calculations. Note that as the band gap of IGZO, a reference value of 3.05 eV (IGZO1) and a measured value of 3.15 eV (IGZO2) are shown.

TABLE 1

|  | Si | IGZO(1) | IGZO(2) |
|---|---|---|---|
| Nc (300K) [cm$^{-3}$] | $2.8 \times 10^{19}$ | $5.0 \times 10^{18}$ | $5.0 \times 10^{18}$ |
| Nv (300K) [cm$^{-3}$] | $1.04 \times 10^{19}$ | $5.0 \times 10^{18}$ | $5.0 \times 10^{18}$ |
| Eg (300K) [eV] | 1.08 | 3.05 | 3.15 |
| $n_i$ (300K) [cm$^{-3}$] | $1.45 \times 10^{10}$ | $1.2 \times 10^{-7}$ | $1.7 \times 10^{-8}$ |

The results in Table 1 show that the intrinsic carrier density of IGZO is much lower than that of Si. In the case where 3.05 eV is selected as the band gap of IGZO, the difference between the intrinsic carrier concentration of Si and the intrinsic carrier concentration of IGZO is about a 17-digit difference.

Next, the significantly low off-state current of the highly purified oxide semiconductor is described in detail.

Figure 19:
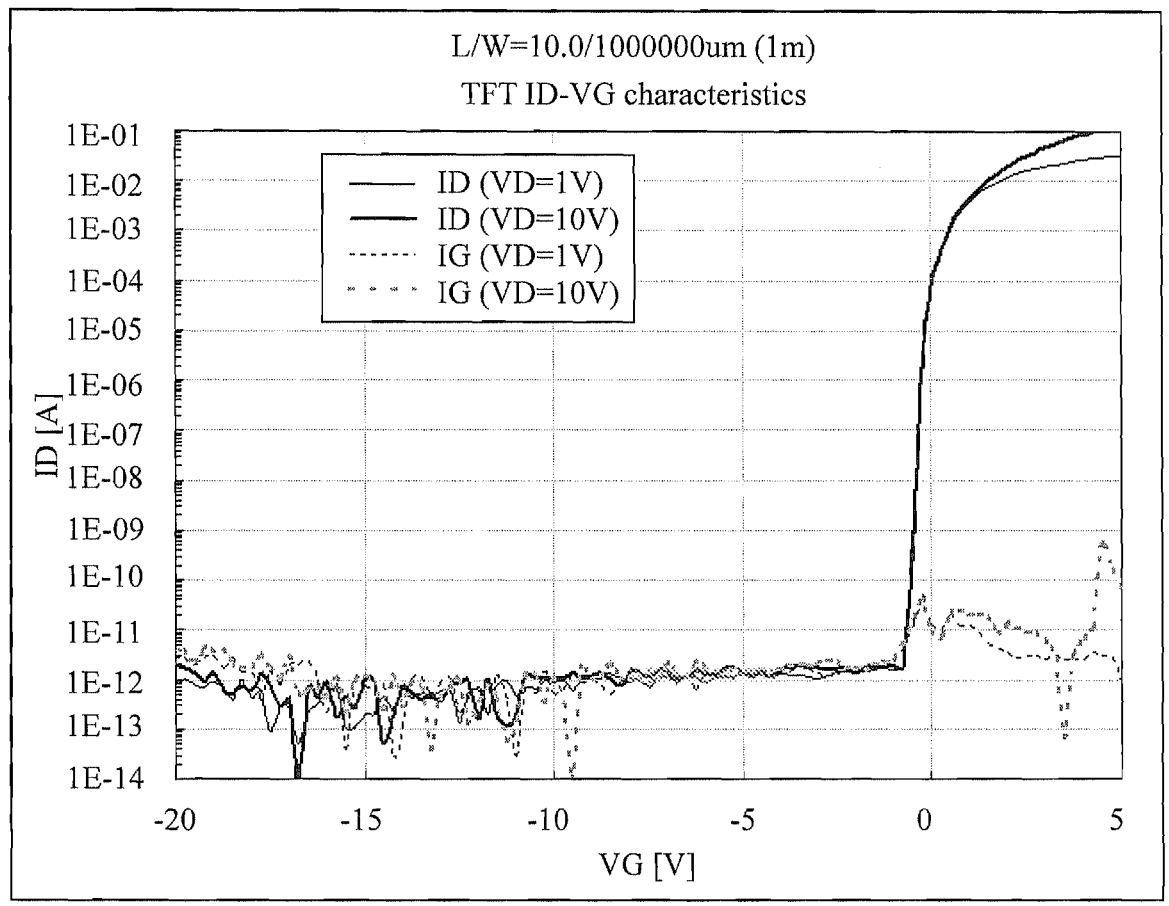
FIG. 19 shows $I_D$-$V_G$ characteristics of a TFT in one embodiment of the present invention.

As described above, the number of minority carriers in the highly purified oxide semiconductor is sufficiently small. In order to estimate the lower limit of the off-state current, the off-state current of a thin film transistor having a channel width W of 1 m and including a highly purified oxide semiconductor in a semiconductor layer was measured. FIG. 19 is a graph showing drain current when gate voltage is applied. As shown in FIG. 19, the off-state current is $1\times10^{-12}$ A or less that is the detection limit of a measurement device. In this case, when the channel width W of the thin film transistor is estimated to be 1 μm, the off-state current is 1 aA or less ($1\times10^{-18}$ A or less).

As one of the factors that helps the off-state current of the thin film transistor to occur, it is known that a carrier supplied to a channel through generation and recombination of an electron and a hole flows. As the generation and recombination, there are direct generation and recombination where an electron is excited from the valence band (Ev) to the conduction band (Ec) and indirect generation and recombination caused via a localized level (Et) in a band gap. In general, in the case of a semiconductor with a small band gap, such a semiconductor has a higher carrier concentration than a semiconductor with a large band gap; thus, generation and recombination caused via a localized level are actively performed. In contrast, in the case of a semiconductor with a large band gap, such as a highly purified oxide semiconductor, such a semiconductor has a lower carrier concentration than a semiconductor with a small band gap; thus, generation and recombination are not often performed and minority carriers are not likely to be supplied. Accordingly, off-state current caused by generation and recombination of carriers is low.

Note that as wide gap semiconductors, for example, SiC (3.26 eV) and GaN (3.39 eV) are known. These materials are expected as next-generation materials because they have breakdown electric field strength which is one digit larger than that of Si and high heat resistance. However, in a semiconductor process using these materials, treatment at 1000° C. or higher is performed; thus, it is impossible to form a device over a glass substrate. In contrast, as a highly purified oxide semiconductor, a thin film is formed at room temperature to 400° C. by sputtering, and dehydration, dehydrogenation, and excessive oxidation can be performed at 450 to 700° C.; thus, the highly purified oxide semiconductor has a less adverse effect in a semiconductor process than SiC or GaN with the same or substantially the same band gap.

By drastically removing hydrogen contained in an oxide semiconductor as described above, in a thin film transistor which includes a highly purified oxide semiconductor in a channel formation region, the number of minority carriers and the amount of off-state current can be significantly reduced. In other words, in circuit design, an oxide semiconductor layer can be regarded as an insulator when the thin film transistor is off. In contrast, the mobility of the oxide semiconductor layer is approximately two digits larger than that of a semiconductor layer formed using amorphous silicon when the thin film transistor is on.

On the other hand, a thin film transistor including low-temperature polysilicon is designed on the assumption that off-state current is about 10000 times as high as that of a thin film transistor including an oxide semiconductor. Therefore, in the case where the thin film transistor including an oxide semiconductor is compared with the thin film transistor including low-temperature polysilicon, the voltage hold time of the thin film transistor including an oxide semiconductor can be extended about 10000 times when storage capacitances are equal or substantially equal to each other (about 0.1 pF). Further, in the case of a thin film transistor including amorphous silicon, off-state current per micrometer of channel width is $1 \times 10^{-13}$ A/μm or more. Therefore, when storage capacitances are equal to or substantially equal to each other (about 0.1 pF), the voltage hold time of a transistor including a high-purity oxide semiconductor can be extended $10^4$ times or more as long as that of the thin film transistor including amorphous silicon.

Specifically, an image signal can be held in each pixel for a longer period of time in the case of a thin film transistor including an oxide semiconductor layer. Thus, for example, an interval between rewrites of image signals in displaying still images can be 10 seconds or longer, preferably 30 seconds or longer, more preferably one minute or longer and shorter than ten minutes. In other words, the hold time can be extended and the frequency of supplies of image signals and common potentials to a pixel electrode and a counter electrode can be reduced particularly when still images are displayed. Thus, power consumption can be reduced.

Note that in displaying still images, refresh operation may be performed as appropriate considering a retention rate of voltage applied to a liquid crystal element in a hold period. For example, refresh operation may be performed at timing of when the level of voltage is decreased to a certain level with respect to the level (initial level) of voltage immediately after a signal is written to a pixel electrode of a liquid crystal element. The certain level of voltage is preferably set to a level at which a flicker is not perceived with respect to the initial level. Specifically, in the case where a display object is an image, refresh operation (a repetitive rewrite of an image signal) is preferably performed every time the voltage becomes 1%, preferably 0.3% lower than the initial level. Further, in the case where a display object is a character, refresh operation (a repetitive rewrite of an image signal) is preferably performed every time the voltage becomes 10%, preferably 3% lower than the initial level.

Note that, for example, in the case of a pixel including a transistor formed using low-temperature polysilicon, a moving image is generally displayed at 60 frames per second (16 msec per frame). The same can be applied to the case where a still image is displayed because if a refresh rate is decreased (an interval between rewrites of image signals is extended), the voltage of the pixel is lowered, which adversely affects the image display. In contrast, in the case where the transistor including an oxide semiconductor layer is used, the hold time per image signal rewrite can be extended to 160 seconds which is about $10^4$ times as long as that of the transistor formed using low-temperature polysilicon because off-state current is low.

Since the hold time per image signal rewrite can be extended, the frequency of each image signal rewrite can be reduced particularly when a still image is displayed. For example, the frequency of rewrites of image signals in a period during which one still image is displayed can be once or n times. Note that n is greater than or equal to 2 and less than or equal to $10^3$. Thus, the power consumption of a liquid crystal display device can be reduced.

Note that the resistance to flow of the off-state current of a thin film transistor can be referred to as off-state resistivity. The off-state resistivity is resistivity of a channel formation region when the thin film transistor is off, and the off-state resistivity can be calculated from off-state current.

Specifically, if the amount of off-state current and the level of drain voltage are known, resistance when the transistor is off (off resistance R) can be calculated using Ohm's law. In addition, if a cross section A of the channel formation region and the length L of the channel formation region (the length corresponds to a distance between a source electrode and a drain electrode) are known, off-state resistivity ρ can be calculated from the formula ρ=RA/L (R is off resistance).

Here, the cross section A can be calculated from the formula A=dW (d is the thickness of the channel formation region and W is the channel width). In addition, the length L of the channel formation region is channel length L. In this manner, the off-state resistivity can be calculated from the off-state current.

The off-state resistivity of the transistor including an oxide semiconductor in a semiconductor layer in this embodiment is preferably $1\times10^9$ Ω·m or more, more preferably $1\times10^{10}$ Ω·m or more.

Since an image signal can be held for a longer period of time, the frequency of rewrites of image signals can be reduced particularly when a still image is displayed. Thus, the power consumption of a driver circuit portion can be reduced.

Note that a high power supply potential $V_{dd}$ is a potential which is higher than a reference potential, and a low power supply potential is a potential which is lower than or equal to the reference potential. Note that both the high power supply potential and the low power supply potential are preferably potentials with which a thin film transistor can operate.

Note that voltage is a difference between a given potential and a reference potential (e.g., a ground potential) in many cases. Thus, voltage, a potential, and a potential difference can also be referred to as a potential and voltage.

Note that in the case where an image signal Data for displaying a moving image or a still image which is input to the memory circuit 1002 is an analog signal, the image signal may be converted into a digital signal through an A/D converter or the like to be input to the memory circuit 1002. When the image signal is converted into a digital signal in advance, detection of a difference of the image signal that is to be performed later can be easily performed, which is preferable.

The memory circuit 1002 includes a plurality of frame memories 1008 for storing image signals for a plurality of frames. The number of frame memories 1008 included in the memory circuit 1002 is not particularly limited to a certain number as long as the image signals for the plurality of frames can be stored. Note that the frame memory 1008 may be formed using a memory element such as a dynamic random access memory (DRAM) or a static random access memory (SRAM), for example.

Note that the number of frame memories 1008 is not particularly limited to a certain number as long as an image signal is stored every frame period. Further, the image signals stored in the frame memories 1008 are selectively read by the comparison circuit 1003 and the display control circuit 1004.

The comparison circuit 1003 is a circuit for selectively reading image signals in a series of frame periods that are stored in the memory circuit 1002, comparing the image signals in pixels in the series of frame periods, and calculating differences of the image signals. Note that the difference of the image signal may be any difference as long as it can be obtained by calculation of a difference between gray levels of the image signals in the series of frame periods, for example.

By calculation of the differences of the image signals in the comparison circuit 1003, when differences are detected in all the pixels, a series of frame periods during which the differences are detected are judged as periods during which moving images are displayed. In addition, by calculation of the differences of the image signals in the comparison circuit 1003, when differences are detected in some of the pixels, a series of frame periods during which the differences are detected are judged as periods during which partial moving images are displayed. Further, by calculation of the differences of the image signals in the comparison circuit 1003, when differences are not detected in all the pixels, a series of frame periods during which the differences are not detected are judged as periods during which still images are displayed. In other words, by detection of differences through calculation of the differences in the comparison circuit 1003, the image signals in the series of frames are judged as images signals for displaying moving images, image signals for displaying partial moving images, or image signals for displaying still images. Note that a difference obtained by calculation in the comparison circuit 1003 may be set so as to be judged as a difference when it exceeds a certain level. The comparison circuit 1003 may be set so as to judge detection of differences by the absolute values of the differences regardless of the values of the differences.

Note that by switching of a plurality of images which are time-divided into a plurality of frames at high speed, the images are recognized as a motion image by human eyes. Specifically, by switching of images at least 60 times (60 frames) per second, the images are recognized as a moving image with less flicker by human eyes. In contrast, unlike a moving image and a partial moving image, a still image is an image which does not change in a series of frame periods, for example, in an n-th frame and an (n+1)th frame though a plurality of images which are time-divided into a plurality of frame periods are switched at high speed. Further, by switching of a plurality of images which are time-divided into a plurality of frames at high speed, the images are recognized as a partial moving image by human eyes. The partial moving image has a region where an image signal in each pixel is changed in a series of frame periods, for example, an n-th frame and an (n+1)th frame and a region where the image signal in each pixel is not changed in a series of frame periods, for example, the n-th frame and the (n+1)th frame. Note that when the difference of an image signal is calculated in the comparison circuit 1003, the image signal is preferably a digital signal.

The display control circuit 1004 is a circuit for reading the image signal Data from the memory circuit 1002 in order to supply the image signal Data to a pixel where the difference is detected in response to detection of the difference of the image signal in the comparison circuit 1003 and for supplying a signal which controls the driver circuit portion 1005.

In order to describe the specific operation of the display control circuit 1004, a simple model of a pixel in the pixel portion is illustrated, and the change in an image signal when an image is a moving image, a still image, or a partial moving image is described.

Figure 2A:
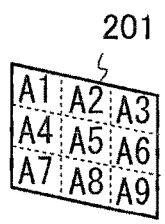
FIGS. 2A and 2B illustrate a liquid crystal display device in one embodiment of the present invention.

First, FIG. 2A illustrates a schematic diagram of a pixel portion 201 including pixels in three rows and three columns. A pixel in a first row and a first column is denoted by A1, and pixels up to a pixel in a third row and a third column are denoted by A1 to A9. Note that as a matter of course, in an actual liquid crystal display device, the number of pixels in a pixel portion is often several tens of thousands, and the frequency of supplies of image signals to the pixels is increased.

Figure 2B:
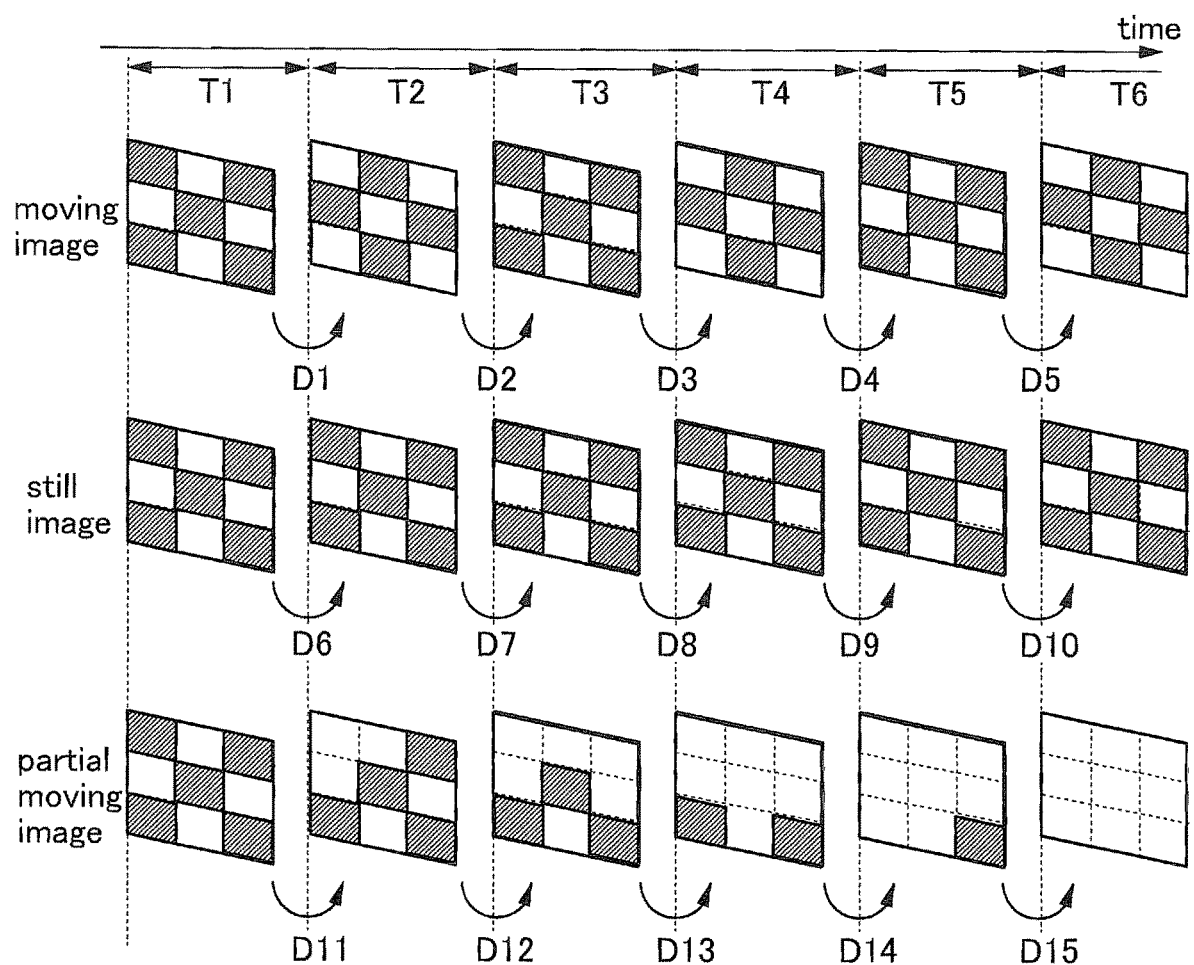

Next, in order to describe a series of moving images, FIG. 2B illustrates the change in images in a plurality of periods, for example, in each one frame period, i.e., the change in image signals in pixels that corresponds to FIG. 2A. In FIG. 2B, image signals which are input to the pixels are illustrated while the frame periods are referred to as first to sixth periods T1 to T6. FIG. 2B illustrates the change in the image signals in the pixels when a moving image, a still image, and a partial moving image are displayed. Note that gray levels expressed in the pixels with the use of image signals are two gray levels for purposes of illustration and are indicated by non-shaded regions and shaded regions in FIG. 2B. Further, FIG. 2B illustrates differences D1 to D5, differences D6 to D10, and differences D11 to D15 as the change in images in periods.

In the first period T1 of a moving image illustrated in FIG. 2B, image signals are supplied so that A1 in the first row and the first column, A3 in the first row and the third column, A5 in a second row and a second column, A7 in the third row and the first column, and A9 in the third row and the third column are shaded regions, and A2 in the first row and the second column, A4 in the second row and the first column, A6 in the second row and the third column, and A8 in the third row and the second column are non-shaded regions. Further, in the second period T2 of the moving image illustrated in FIG. 2B, image signals are supplied so that A2 in the first row and the second column, A4 in the second row and the first column, A6 in the second row and the third column, and A8 in the third row and the second column are shaded regions, and A1 in the first row and the first column, A3 in the first row and the third column, A5 in the second row and the second column, A7 in the third row and the first column, and A9 in the third row and the third column are non-shaded regions. That is, the image signals supplied are switched in a series of periods in all the pixels; thus, the difference D1 calculated in the comparison circuit 1003 is detected in all the pixels. In other words, the display control circuit 1004 controls the driver circuit portion 1005 and reads the image signals from the memory circuit 1002 so that the image signals are supplied only to pixels where the difference D1 is detected.

Similarly, in the second period T2 and the third period T3 of the moving image, image signals are switched in all the pixels A1 to A9. Therefore, the difference D2 calculated in the comparison circuit 1003 is detected in all the pixels. In other words, the display control circuit 1004 controls the driver circuit portion 1005 and reads the image signals from the memory circuit 1002 so that the image signals are supplied only to pixels where the difference D2 is detected. Similarly, in the case of the moving image, by detection of differences of image signals in all the pixels, the differences D3 to D5 can be obtained by calculation in the comparison circuit 1003. In other words, in the case of the moving image, a difference between a series of frames is detected in all the pixels by calculation in the comparison circuit 1003; thus, the display control circuit 1004 controls the driver circuit portion 1005 and reads the image signals from the memory circuit 1002 so that the image signals are supplied to all the pixels.

In the first period T1 of a still image illustrated in FIG. 2B, image signal are supplied so that A1 in the first row and the first column, A3 in the first row and the third column, A5 in the second row and the second column, A7 in the third row and the first column, and A9 in the third row and the third column are shaded regions, and A2 in the first row and the second column, A4 in the second row and the first column, A6 in the second row and the third column, and A8 in the third row and the second column are non-shaded regions. Further, in the second period T2 of the still image illustrated in FIG. 2B, the image signals are supplied so that A1 in the first row and the first column, A3 in the first row and the third column, A5 in the second row and the second column, A7 in the third row and the first column, and A9 in the third row and the third column are shaded regions, and A2 in the first row and the second column, A4 in the second row and the first column, A6 in the second row and the third column, and A8 in the third row and the second column are non-shaded regions. That is, the image signals are not changed in all the pixels; thus, the difference D6 calculated in the comparison circuit 1003 is not detected in all the pixels. In other words, the display control circuit 1004 neither controls the driver circuit portion 1005 nor reads the image signals from the memory circuit 1002 because the difference D6 is not detected.

Similarly, in the second period T2 and the third period T3, image signals are not changed in all the pixels. Therefore, the difference D7 calculated in the comparison circuit 1003 is not detected in all the pixels. In other words, it is not necessary to supply image signals to the pixels, to control the driver circuit portion 1005, and to read the image signals from the memory circuit 1002 because the difference D7 is not detected. Similarly, in the case of the still image, since differences of image signals are not detected in all the pixels, the differences D8 to D10 calculated in the comparison circuit 1003 are not detected. In other words, in the case of the still image, a difference between a series of frames is not detected by calculation in the comparison circuit 1003; thus, the display control circuit 1004 does not control the driver circuit portion 1005 and reading of the image signals from the memory circuit 1002 can be omitted. Accordingly, power consumption can be reduced.

In the structure of this embodiment, by provision of a thin film transistor including an oxide semiconductor in a semiconductor layer in each pixel, the supply of an image signal is controlled. As described above, the off-state current of the thin film transistor including an oxide semiconductor in a semiconductor layer can be reduced. Therefore, if the same image signal is used, a still image can be displayed without additional supply of an image signal.

Note that in displaying still images for a long time, refresh operation may be performed in such a manner that an image signal is supplied every certain period and a potential which is based on an image signal held in each pixel is supplied again. For example, refresh operation may be performed at timing of when the level of voltage is decreased to a certain level with respect to the level (initial level) of voltage immediately after a signal is written to a pixel electrode of a liquid crystal element. The certain level of voltage is preferably set to a level at which a flicker is not perceived with respect to the initial level. Specifically, in the case where a display object is an image, refresh operation (a repetitive rewrite of an image signal) is preferably performed every time the voltage becomes 1.0%, preferably 0.3% lower than the initial level. Further, in the case where a display object is a character, refresh operation (a repetitive rewrite of an image signal) is preferably performed every time the voltage becomes 10%, preferably 3% lower than the initial level.

In the first period T1 of a partial moving image illustrated in FIG. 2B, image signals are supplied so that A1 in the first row and the first column, A3 in the first row and the third column, A5 in the second row and the second column, A7 in the third row and the first column, and A9 in the third row and the third column are shaded regions, and A2 in the first row and the second column, A4 in the second row and the first column, A6 in the second row and the third column, and A8 in the third row and the second column are non-shaded regions. Further, in the second period T2 of the partial moving image illustrated in FIG. 2B, image signals are supplied so that A3 in the first row and the third column, A5 in the second row and the second column, A7 in the third row and the first column, and A9 in the third row and the third column are shaded regions, and A1 in the first row and the first column, A2 in the first row and the second column, A4 in the second row and the first column, A6 in the second row and the third column, and A8 in the third row and the second column are non-shaded regions. In other words, in the case of the partial moving image, the difference D11 between frames is detected in one of the pixels, and the difference D11 between the frames that is calculated in the comparison circuit 1003 is not detected in the other pixels. Specifically, the difference D11 is detected only in A1 in the first row and the first column by calculation in the comparison circuit 1003. Thus, the display control circuit 1004 controls the driver circuit portion 1005 and reads the image signal from the memory circuit 1002 so that the image signal is supplied only to the pixel A1 in the first row and the first column.

Similarly, in the second period T2 and the third period T3, an image signal is switched only in the pixel A3 in the first row and the third column. Therefore, the difference D12 calculated in the comparison circuit 1003 is detected only in the pixel A3 in the first row and the third column. In other words, the display control circuit 1004 controls the driver circuit portion 1005 and reads the image signal from the memory circuit 1002 so that the image signal is supplied only to the pixel where the difference D12 is detected. Similarly, in the case of the partial moving image, by detection of differences of image signals in some of the pixels by calculation in the comparison circuit 1003, the differences D13 to D15 can be obtained. In other words, in the case of the partial moving image, a difference between a series of frames is detected in some of the pixels by calculation in the comparison circuit 1003; thus, the display control circuit 1004 controls the driver circuit portion 1005 and reads the image signals from the memory circuit 1002 so that the image signals are supplied to some of the pixels.

As described in the examples of FIGS. 2A and 2B, in order to determine whether an image is a moving image, a still image, or a partial moving image, differences of image signals between frames are calculated in the comparison circuit 1003 so as to be extracted in pixels, and the display control circuit 1004 performs control so that the image signals are supplied to the pixels where the differences are detected. Therefore, when operation for inputting the same image signal to a pixel to which an image signal which is the same as the signal in the preceding period is input again is omitted, the number of additional supplies of image signals to pixels can be significantly reduced. Accordingly, the number of operations of the driver circuit portion can be reduced, so that power consumption can be reduced.

Figure 3A:
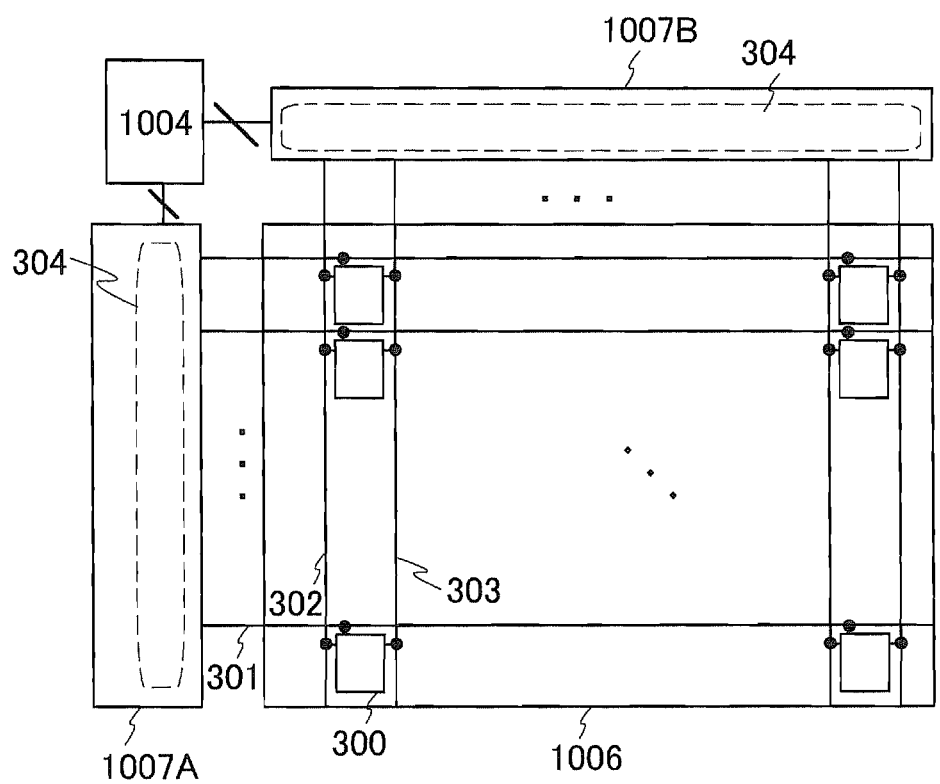
FIGS. 3A and 3B illustrate a liquid crystal display device in one embodiment of the present invention.

Next, each structure of the driver circuit portion and the pixel portion in this embodiment is described. FIG. 3A illustrates the display control circuit 1004, the pixel portion 1006, the gate line driver circuit 1007A, and the signal line driver circuit 1007B. The pixel portion 1006 includes a plurality of pixels 300. A gate line 301 which extends from the gate line driver circuit 1007 and a signal line 302 and a selection line 303 which extend from the signal line driver circuit 1007B are connected to each of the pixels 300. Note that in FIG. 3A, the gate line driver circuit 1007A and the signal line driver circuit 1007B include decoder circuits 304, and signals output from address lines of the display control circuit 1004 are controlled.

Note that when it is explicitly described that "A and B are connected", the case where A and B are electrically connected, the case where A and B are functionally connected, and the case where A and B are directly connected are included. Here, each of A and B is an object (e.g., a device, an element, a circuit, a wiring, an electrode, a terminal, a conductive film, or a layer). Accordingly, another element may be interposed between elements having a connection relation illustrated in drawings and texts, without limitation to a predetermined connection relation, for example, the connection relation illustrated in the drawings and the texts.

Figure 3B:
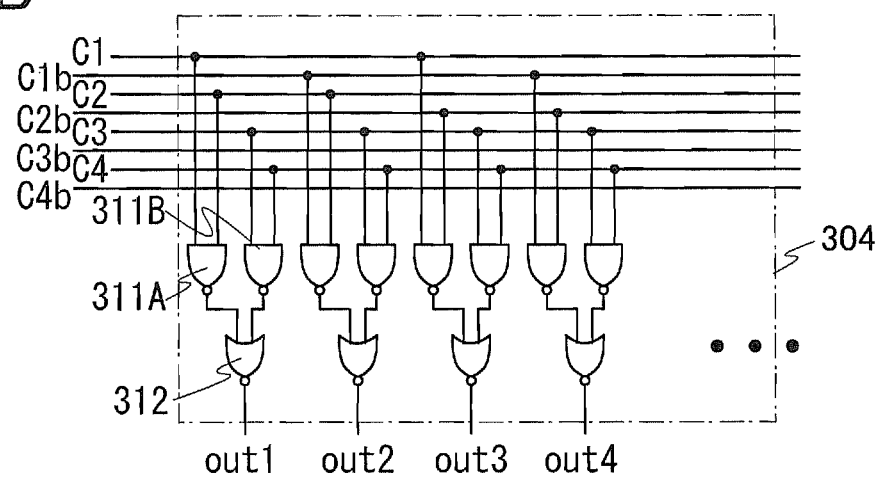

FIG. 3B illustrates an example of the decoder circuit. The decoder circuit inputs address signals to NAND circuits 311A and 311B from address lines C1, C1b, C2, C2b, C3, C3b, C4, and C4b and outputs the outputs of the NAND circuits 311A and 311B to an output terminal OUT1 through a NOR circuit 312. With the structure in FIG. 3B, the potentials of the address lines can be controlled in the display control circuit 1004, and the potential of the output terminal can be selectively controlled.

Figure 4A:
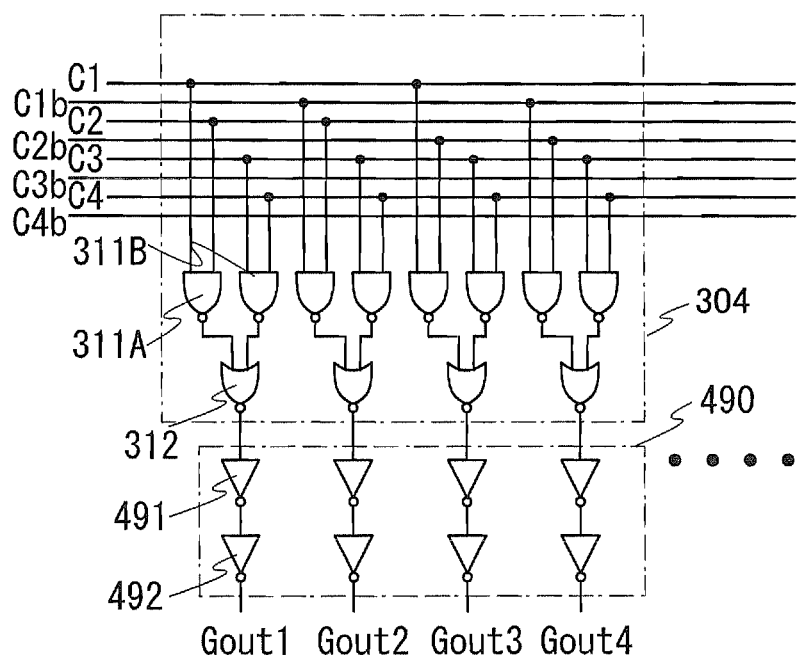
FIGS. 4A and 4B illustrate a liquid crystal display device in one embodiment of the present invention.
Figure 4B:
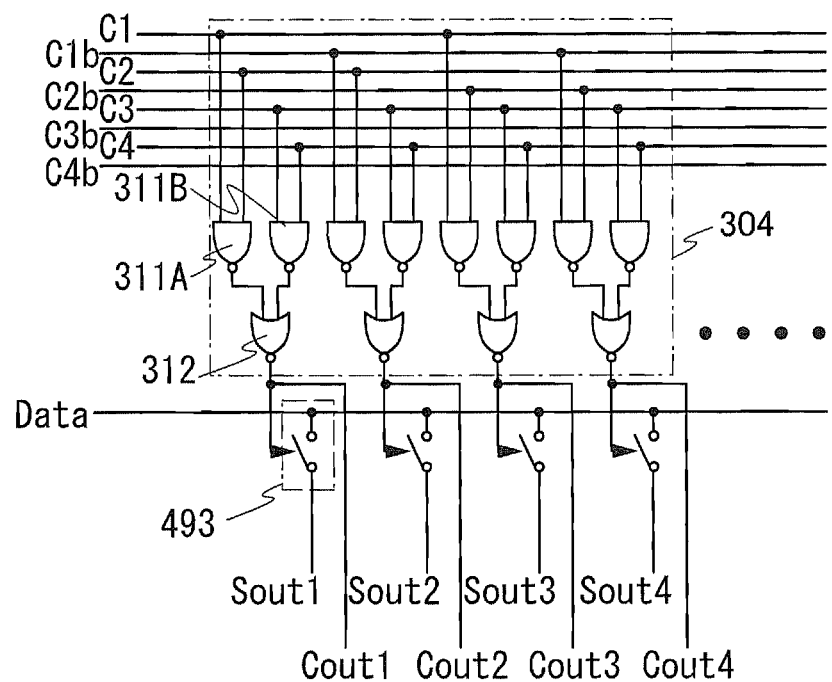

FIG. 4A illustrates an example of the gate line driver circuit 1007A including the decoder circuit. Specifically, FIG. 4A illustrates a structure where the gate line driver circuit 1007A includes a buffer circuit 490 in addition to the structure of the decoder circuit 304 in FIG. 3B. Inverter circuits 491 and 492 may be connected in series as the buffer circuit 490 so that signals are output to gate lines Gout. FIG. 4B illustrates an example of the signal line driver circuit 1007B including the decoder circuit 304. Specifically, FIG. 4B illustrates a structure where the signal line driver circuit 1007B includes a switch 493 in addition to the structure of the decoder circuit 304 in FIG. 3B. The output of the NOR circuit 312 may be used for switching on/off of the switch, and the image signal Data may be output to signal lines Sout and the output of the NOR circuit 312 may be used as the output of selection lines Cout.

When the decoder circuits 304 are used in the gate line driver circuit 1007A and the signal line driver circuit 1007B as described above, a given gate line, a given signal line, or a given selection line can be selected, that is, the supply of an image signal to a given pixel can be controlled when an address is specified by the display control circuit 1004.

Figure 5:
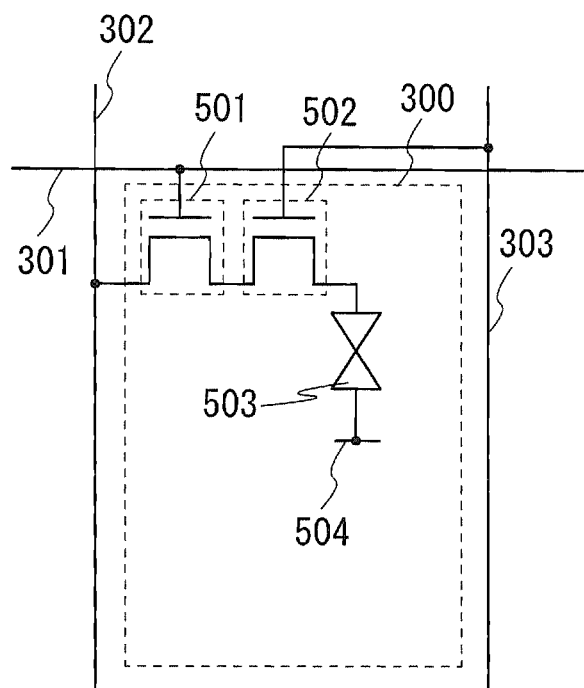
FIG. 5 illustrates a liquid crystal display device in one embodiment of the present invention.

FIG. 5 illustrates an example of the structure of the pixel 300 in FIG. 3B. The pixel 300 includes a first thin film transistor 501, a second thin film transistor 502, a liquid crystal element 503, and a counter electrode 504. A gate terminal of the first thin film transistor 501 is connected to the gate line 301. A first terminal of the first thin film transistor 501 is connected to the signal line 302. A second terminal of the first thin film transistor 501 is connected to a second terminal of the second thin film transistor 502. A gate terminal of the second thin film transistor is connected to the selection line 303. A first terminal of the second thin film transistor is connected to one electrode (also referred to as a first electrode) of the liquid crystal element 503. The other electrode of the liquid crystal element is connected to the counter electrode 504. When the pixel is selected, the first thin film transistor 501 and the second thin film transistor 502 are turned on, so that an image signal can be supplied to the first electrode side of the liquid crystal element 503.

Note that in FIG. 5, a storage capacitor may be connected in parallel to the liquid crystal element. The capacitance of the storage capacitor may be set considering the leakage current of a thin film transistor provided in a pixel portion or the like so that electric charge can be held for a certain period. The capacitance of the storage capacitor may be set considering the off-state current of the thin film transistor, or the like. In this embodiment, since a transistor including a high-purity oxide semiconductor layer is used as the thin film transistor, it is sufficient to provide a storage capacitor having capacitance which is ⅓ or less, preferably ⅕ or less of liquid crystal capacitance in each pixel.

The specific resistance of a liquid crystal material is $1\times10^{12}$ Ω·cm or higher, preferably higher than $1\times10^{13}$ Ω·cm, more preferably higher than $1\times10^{14}$ Ω·cm. Note that the specific resistance in this specification is measured at 20° C. In the case where a liquid crystal element (also referred to as a liquid crystal cell) in which a liquid crystal is held between electrodes is used, the specific resistance of the liquid crystal is $1\times10^{11}$ Ω·cm or higher, preferably higher than $1\times10^{12}$ Ω·cm in some cases because there is a possibility that an impurity might be mixed into the liquid crystal from a component such as an alignment film or a sealant.

As the liquid crystal material, a thermotropic liquid crystal, a low-molecular liquid crystal, a polymer liquid crystal, a polymer dispersed liquid crystal, a ferroelectric liquid crystal, an anti-ferroelectric liquid crystal, or the like is used. Such a liquid crystal material exhibits a cholesteric phase, a smectic phase, a cubic phase, a chiral nematic phase, an isotropic phase, or the like depending on conditions.

As the specific resistance of the liquid crystal material becomes higher, the amount of electric charge which leaks through the liquid crystal material can be reduced, so that the decrease over time in voltage for holding the operation state of the liquid crystal element can be suppressed. Accordingly, the hold time can be extended, so that the frequency of rewrites of image signals can be reduced and the power consumption of the liquid crystal display device can be reduced.

Further, as the liquid crystal material, a liquid crystal material exhibiting a blue phase may be used. A blue phase is one of liquid crystal phases that is generated just before a cholesteric phase changes into an isotropic phase while the temperature of a cholesteric liquid crystal is raised. Since the blue phase appears only in a narrow temperature range, a liquid crystal composition containing a chiral material at 5 wt % or more of is used for a liquid crystal layer in order to improve the temperature range. A liquid crystal composition containing a liquid crystal showing a blue phase and a chiral agent has a short response time of 1 msec or less and is optically isotropic; thus, alignment treatment is not necessary and viewing angle dependence is small. In addition, since an alignment film does not need to be provided, rubbing treatment is not necessary. Thus, electrostatic discharge caused by rubbing treatment can be prevented and defects and damage of the liquid crystal display device in a manufacturing process can be reduced. Therefore, productivity of the liquid crystal display device can be improved. A thin film transistor including an oxide semiconductor layer particularly has a possibility that electrical characteristics of the thin film transistor might fluctuate significantly due to the influence of static electricity and deviate from the designed range. Therefore, it is more effective to use a blue phase liquid crystal material for a liquid crystal display device including a thin film transistor having an oxide semiconductor layer.

The structure of this embodiment is not limited to a liquid crystal display device and can also be applied to an EL display device including a light-emitting element such as an electroluminescent element (also referred to as an EL element) as a display element.

In the structure of the pixel 300 illustrated in FIG. 5, the first thin film transistor 501 and the second thin film transistor 502 in a selected pixel are turned on by control of the gate line 301, the signal line 302, and the selection line 303 so that an image signal can be supplied to the liquid crystal element 503. Therefore, when a moving image or a partial moving image is displayed, an image signal can be supplied only to a pixel where a difference of the image signal between a series of frames is detected.

As described above, in this embodiment, when thin film transistors including oxide semiconductors are used as the first thin film transistor 501 and the second thin film transistor 502, off-state current can be reduced. Therefore, it is possible to obtain a liquid crystal display device in which voltage can be held in a storage capacitor for a longer time and power consumption when a still image is displayed can be reduced.

This embodiment can be combined with any of the structures described in the other embodiments as appropriate.

Embodiment 2

In this embodiment, in addition to the structure described in the above embodiment, a structure with which voltage can be held for a longer time when a still image is displayed is described. In this embodiment, a schematic diagram, a circuit diagram, and the like of a liquid crystal display device which can be described in addition to the structure in the above embodiment are illustrated, and advantageous effects of the structure in this embodiment are described.

Figure 6A:
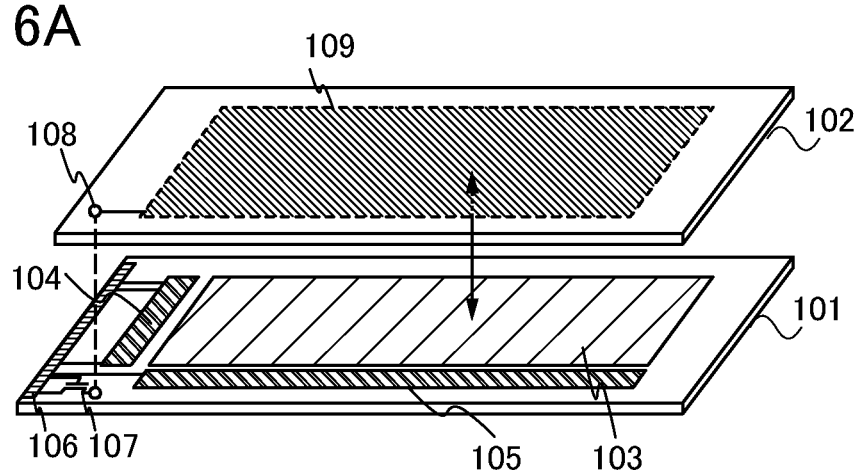
FIGS. 6A to 6C illustrate a liquid crystal display device in one embodiment of the present invention.

A liquid crystal display device illustrated in FIG. 6A includes a first substrate 101 and a second substrate 102. The first substrate 101 includes a pixel portion 103, a gate line driver circuit 104, a signal line driver circuit 105, a terminal portion 106, and a switching transistor 107. The second substrate 102 includes a common connection portion 108 (also referred to as a common contact) and a counter electrode 109.

It is necessary that the first substrate 101 and the second substrate 102 have light-transmitting properties and heat resistance high enough to withstand heat treatment to be performed later. A glass substrate used for electronics industry (also referred to as a non-alkali glass substrate), such as an aluminosilicate glass substrate, an aluminoborosilicate glass substrate, or a barium borosilicate glass substrate; a quartz substrate; a ceramic substrate; a plastic substrate; or the like can be used.

Note that the pixel portion 103, the gate line driver circuit 104, the signal line driver circuit 105, and the switching transistor 107 which are illustrated in FIG. 6A may be formed using thin film transistors formed over the first substrate 101. Note that the gate line driver circuit 104 and the signal line driver circuit 105 are not necessarily formed using thin film transistors formed over the first substrate 101 and may be formed using thin film transistors formed over a different substrate or the like which is provided outside the first substrate 101.

Note that as in the description of FIG. 5 in Embodiment 1, a gate line, a signal line, a selection line, and a pixel are provided in the pixel portion 103.

Note that a switching transistor described in this specification is a thin film transistor in which conduction or non-conduction between two terminals, i.e., a source terminal and a drain terminal is selected in response to a potential applied to a gate so that switching operation is realized. For example, a potential which is applied to a gate terminal of the thin film transistor may be controlled so that the thin film transistor operates in a linear region. Note that a potential which is applied to a gate terminal of the switching transistor 107 may be supplied from the terminal portion 106. One of a source terminal and a drain terminal of the switching transistor 107 that is connected to the terminal portion 106 is referred to as a first terminal. The other of the source terminal and the drain terminal of the switching transistor 107 that is connected to the counter electrode through the common connection portion 108 is referred to as a second terminal. Note that a common potential which is supplied to the counter electrode 109 is supplied from the first terminal of the switching transistor 107, and on/off of the switching transistor 107 is controlled by a potential supplied to the gate terminal of the switching transistor 107.

Note that the switching transistor may have any of the following structures: an inverted staggered structure; a staggered structure; a double-gate structure in which a channel region is divided into a plurality of regions and the divided channel regions are connected in series; and a dual-gate structure in which gate electrodes are provided over and below a channel region. Further, a semiconductor layer included in the switching transistor may be divided into a plurality of island-shaped semiconductor layers so that switching operation is realized.

Further, a signal (an address signal) for controlling decoder circuits in the gate line driver circuit 104 and the signal line driver circuit 105, an image signal (also referred to as video voltage, a video signal, or video data), a common potential which is supplied to the counter electrode 109, a signal for operating the switching transistor 107, and the like are supplied to the terminal portion 106.

The common potential may be any potential as long as it serves as reference with respect to the potential of an image signal supplied to a pixel electrode. For example, the common potential may be a ground potential.

The common connection portion 108 is provided for electrically connecting the second terminal of the switching transistor 107 in the first substrate 101 and the counter electrode in the second substrate 102 to each other. The common potential is supplied from the terminal portion 106 to the counter electrode through the switching transistor 107 and the common connection portion 108. As a specific example of the common connection portion 108, a conductive particle in which an insulating sphere is coated with a thin metal film may be used, so that electrical connection is made. Note that two or more common connection portions 108 may be provided between the first substrate 101 and the second substrate 102.

It is preferable that the counter electrode 109 overlap with the pixel electrode included in the pixel portion 103. Further, the counter electrode 109 and the pixel electrode included in the pixel portion 103 may have a variety of opening patterns.

In the case where the pixel portion 103, the gate line driver circuit 104, the signal line driver circuit 105, and the switching transistor 107 are formed over the first substrate 101 or in the case where the pixel portion 103 and the switching transistor 107 are formed over the first substrate 101, an n-channel thin film transistor including a semiconductor layer formed using an oxide semiconductor is used as a thin film transistor included in each circuit. Note that the advantages of usage of an oxide semiconductor for the semiconductor layer of the thin film transistor are as described in Embodiment 1.

In other words, in the case where a switching element or the like is formed using a thin film transistor having significantly low off-state current, the amount of off-state current is small and leakage hardly occurs. Therefore, leakage of electric charge at a node connected to the switching element can be reduced as much as possible, so that the time for holding a potential at the node can be extended.

Figure 6B:
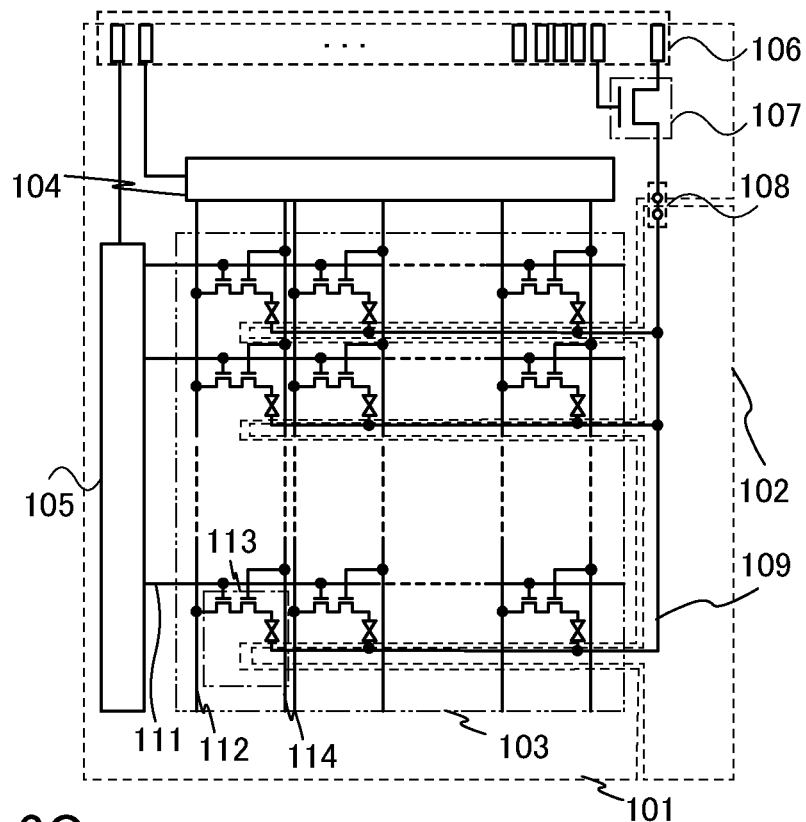

Next, FIG. 6B illustrates a schematic diagram of the liquid crystal display device in FIG. 6A, where the structure of the pixel portion 103 is particularly illustrated in detail.

The liquid crystal display device illustrated in FIG. 6B includes the first substrate 101 and the second substrate 102, as in FIG. 6A. The first substrate 101 includes the pixel portion 103, the gate line driver circuit 104, the signal line driver circuit 105, the terminal portion 106, and the switching transistor 107. The second substrate 102 includes the common connection portion 108 and the counter electrode 109.

In FIG. 6B, a plurality of gate lines 111, a plurality of signal lines 112, and a plurality of selection lines 114 are arranged longitudinally and laterally in the pixel portion 103, and the gate lines 111, the signal lines 112, and the selection lines 114 are provided with pixels 113 each including the first thin film transistor and the second thin film transistor illustrated in FIG. 5 in Embodiment 1 and a liquid crystal element in which a liquid crystal is held between a first electrode and a second electrode. Note that the first electrode of the liquid crystal element corresponds to the pixel electrode, and the second electrode of the liquid crystal element corresponds to the counter electrode 109.

Note that the semiconductor layers of the first thin film transistor and the second thin film transistor included in the pixel are formed using oxide semiconductors, as in the switching transistor 107. With the use of oxide semiconductors, off-state current which flows through the first thin film transistor and the second thin film transistor included in the pixel can be significantly reduced, so that the hold time of a potential supplied to the pixel electrode can be extended.

Figure 6C:
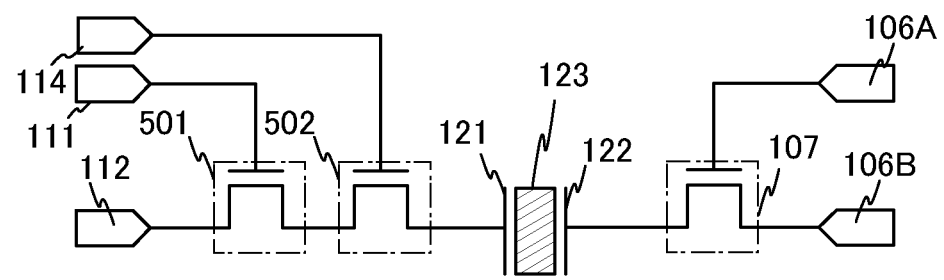

Next, FIG. 6C illustrates a circuit diagram of one of the pixels including pixel electrodes. FIG. 6C focuses on the first thin film transistor 501, the second thin film transistor 502, and the switching transistor 107. The gate terminal of the first thin film transistor 501 is connected to the gate line 111. The first terminal of the first thin film transistor 501 is connected to the signal line 112. The second terminal of the first thin film transistor 501 is connected to the second terminal of the second thin film transistor 502. The gate terminal of the second thin film transistor 502 is connected to the selection line 114. The first terminal of the second thin film transistor 502 is connected to a pixel electrode 121. The gate terminal of the switching transistor 107 is connected to a terminal 106A in the terminal portion 106. The first terminal of the switching transistor 107 is connected to a terminal 106B in the terminal portion 106. The second terminal of the switching transistor 107 is electrically connected to a counter electrode 122 through the common connection portion 108. Note that a liquid crystal 123 is held between the pixel electrode 121 and the counter electrode 122. The pixel electrode 121, the counter electrode 122, and the liquid crystal 123 are collectively referred to as a liquid crystal element in some cases.

Note that any element can be used as the liquid crystal as long as it controls transmission or non-transmission of light by optical modulation action. The optical modulation action of the liquid crystal may be controlled by voltage applied to the liquid crystal, arrangement of the pixel electrode and the counter electrode, or the like.

Next, the operation of the switching transistor 107 is described. In a period during which a still image is displayed, the switching transistor 107 is controlled so as to be off. In that case, in the period during which a still image is displayed, the first thin film transistors 501 and the second thin film transistors 502 are off in all the pixels. In other words, by making opposite electrodes of the liquid crystal 123, i.e., the pixel electrode 121 and the counter electrode 122 be in a floating state, a still image can be displayed without additional supply of a potential. Further, when the operation of the gate line driver circuit 104 and the signal line driver circuit 105 is stopped, power consumption can be reduced.

Note that in a period during which either a moving image or a partial moving image is displayed, the switching transistor 107 is preferably controlled so as to be on.

Note that the resistivity of the liquid crystal 123 in FIG. 6C is approximately $1 \times 10^{12}$ to $1 \times 10^{13}$ Ω·cm. In the period during which a still image is displayed, the opposite electrodes of the liquid crystal 123, i.e., the pixel electrode 121 and the counter electrode 122 are made to be in a floating state by a thin film transistor having significantly low off-state current, i.e., a high-resistant thin film transistor. Therefore, current flowing through the liquid crystal 123 that is generated by voltage applied to opposite ends of the liquid crystal 123 can be reduced.

Accordingly, it is possible to provide a liquid crystal display device in which power consumption is reduced and image distortion is suppressed when a still image is displayed.

As described above, with the structure described in this embodiment, off-state current can be reduced in a pixel which includes a thin film transistor including an oxide semiconductor. Therefore, it is possible to obtain a liquid crystal display device in which voltage can be held in a storage capacitor for a longer time and power consumption when a still image is displayed can be reduced.

This embodiment can be combined with any of the structures described in the other embodiments as appropriate.

Embodiment 3

In this embodiment, structures which are different from the structures of the driver circuits and the pixel portion in Embodiment 1 are described with reference to drawings.

Figure 16:
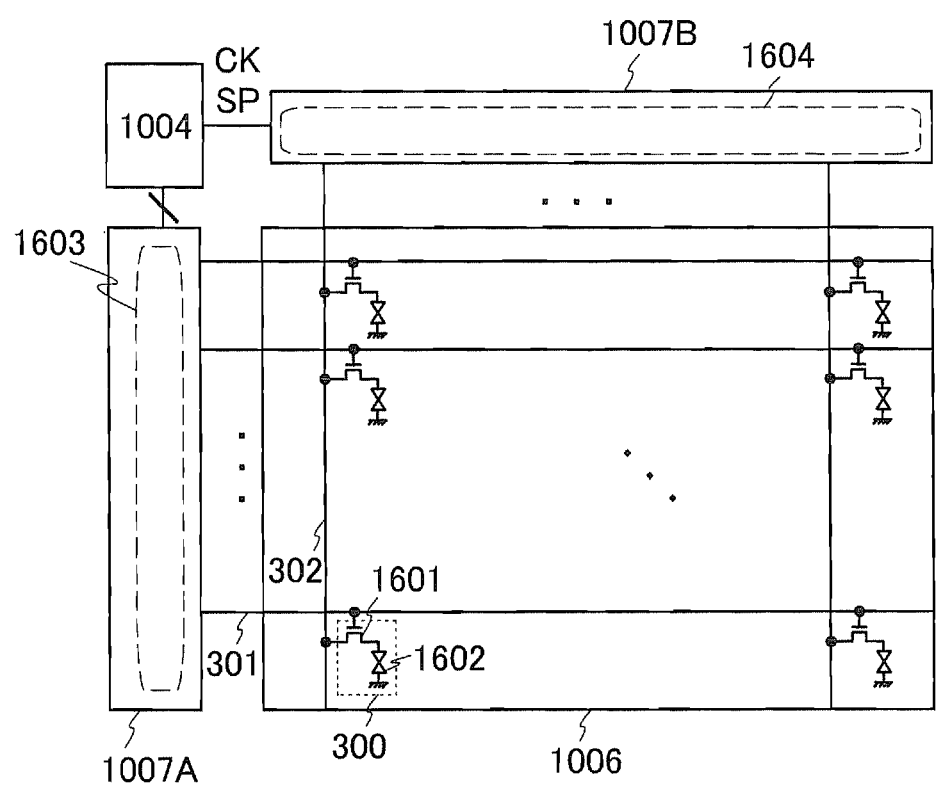
FIG. 16 illustrates a liquid crystal display device in one embodiment of the present invention.

As in FIG. 3A, FIG. 16 illustrates the display control circuit 1004, the pixel portion 1006, the gate line driver circuit 1007A, and the signal line driver circuit 1007B. The pixel portion 1006 includes the plurality of pixels 300. The gate line 301 which extends from the gate line driver circuit 1007 and the signal line 302 which extends from the signal line driver circuit 1007B are connected to each of the pixels 300.

In addition, the pixel 300 in FIG. 16 includes a thin film transistor 1601 and a liquid crystal element 1602. Note that when a semiconductor layer of the thin film transistor 1601 includes an oxide semiconductor as in Embodiment 1, off-state current can be significantly reduced and the frequency of supplies of image signals when a still image is displayed can be reduced.

FIG. 16 illustrates a structure where the gate line driver circuit 1007A includes a decoder circuit 1603, the signal line driver circuit 1007B includes a shift register circuit 1604, and an image signal supplied to the pixel is controlled by an address line from the display control circuit 1004 or a control signal (e.g., a clock signal or a start pulse) of the shift register circuit.

Note that any circuit can be used as the shift register circuit 1604 as long as it sequentially outputs pulses such as a clock signal, an inverted clock signal, and a start pulse SP from an output terminal of a first stage. For example, a shift register circuit to which a pulse output circuit (also referred to as a flip-flop circuit) is cascaded may be used.

FIG. 16 differs from FIG. 3A in that a selection line is not provided, the number of thin film transistors in the pixel is reduced, and the signal line driver circuit 1007B includes the shift register circuit 1604. Thus, in this embodiment, the differences in FIG. 16 and advantageous effects of this embodiment that are different from those in FIG. 3A are described in detail.

As in FIG. 3A, in FIG. 16, a gate line connected to a pixel where a difference is detected by calculation in the comparison circuit 1003 is selected by the decoder circuit 1603 included in the gate line driver circuit 1007A. Unlike FIG. 3A, in FIG. 16, the signal line driver circuit 1007B includes the shift register circuit 1604, and pixels where differences are not detected by calculation in the comparison circuit 1003 are also sequentially selected by the shift register circuit 1604 included in the signal line driver circuit 1007B. However, in the structure in FIG. 16, the selection line is not provided and the number of thin film transistors in the pixel is reduced; thus, the number of wirings and the aperture ratio of the pixel can be improved. Further, even in the structure of this embodiment, when a gate line is selectively driven by the decoder circuit 1603 included in the gate line driver circuit 1007A, power consumption can be reduced.

The structure of this embodiment where the selection line is not provided and the aperture ratio of the pixel can be improved is preferable when a high-definition liquid crystal display device is manufactured. Note that in the structure of this embodiment, selective driving per pixel cannot be performed by the signal line driver circuit 1007B; however, power consumption can be reduced when the gate line driver circuit is selectively driven by the decoder circuit 1603 included in the gate line driver circuit 1007A. Thus, the structure of this embodiment is particularly preferable when a liquid crystal display device in which an image is switched in a row direction is manufactured.

As described above, in this embodiment, when a thin film transistor including an oxide semiconductor is used as the thin film transistor 1601, off-state current can be reduced. Therefore, it is possible to obtain a liquid crystal display device in which voltage can be held in a storage capacitor for a longer time and power consumption when a still image is displayed can be reduced.

This embodiment can be combined with any of the structures described in the other embodiments as appropriate.

Embodiment 4

In this embodiment, examples of advantageous effects when the liquid crystal display device described in the above embodiment is used in a monitor (also referred to as a PC monitor) for an electronic computer (a personal computer) are described.

Figure 17A:
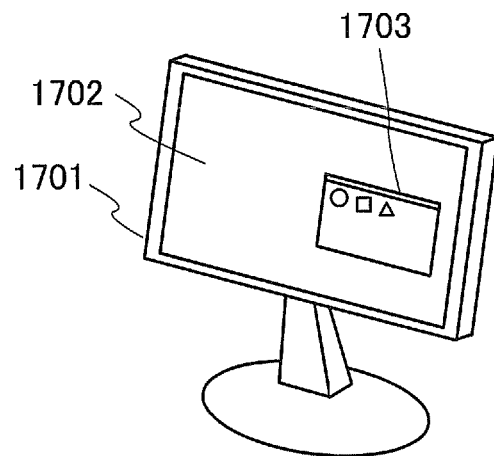
FIGS. 17A to 17C illustrate a liquid crystal display device in one embodiment of the present invention.

FIG. 17A illustrates an example of a liquid crystal display device which includes a display portion 1702 in a housing 1701 and a window-type display portion 1703 in the display portion 1702. The liquid crystal display device in Embodiment 1 is used as the display portion 1702.

Note that although the window-type display portion 1703 is provided in the display portion 1702 for purposes of illustration, a different symbol such as an icon or an image may be employed.

Figure 17B:
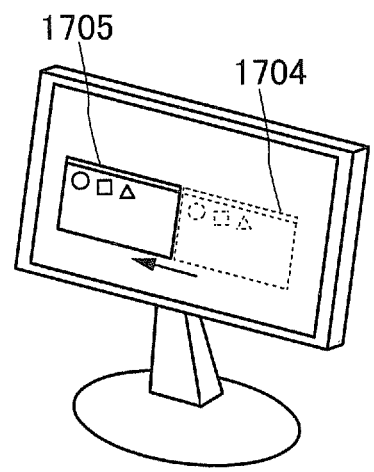
Figure 17C:
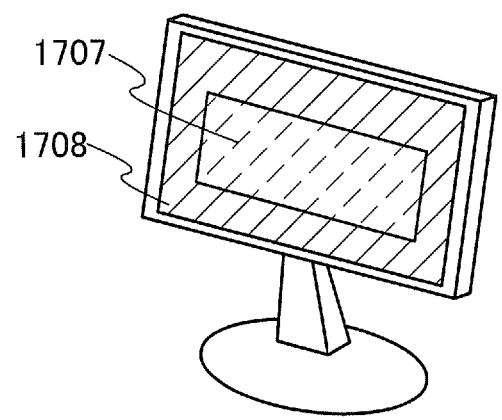

In FIG. 17B, the window-type display portion 1703 in FIG. 17A is moved from a dotted line portion 1704 to a solid line portion 1705. With the movement of the window-type display portion 1703 in FIG. 17B, a partial moving image is displayed in a period of this movement as described in Embodiment 1, and a region 1707 illustrated in FIG. 17C is a region where a difference of an image signal is detected by a comparison circuit and a region 1708 illustrated in FIG. 17C is a region where the difference of the image signal is not detected by the comparison circuit. Note that the region 1707 can be regarded as a region in which a moving image is displayed in accordance with the movement of the window-type display portion and is referred to as a moving image region in some cases. The region 1708 is a region in which the window-type display portion does not move and the image signal is not changed and is referred to as a still image region in some cases.

Figure 18A:
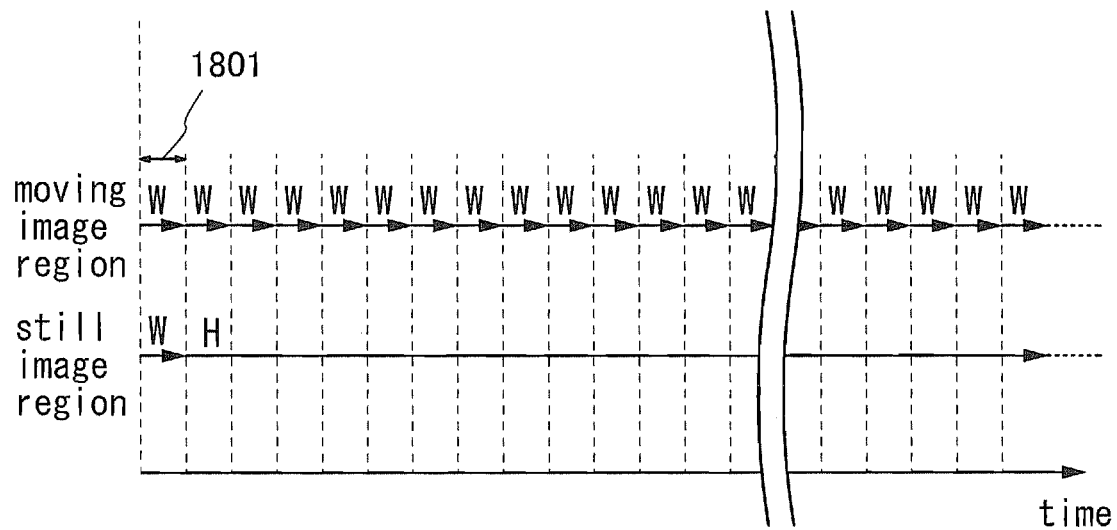
FIGS. 18A and 18B illustrate a liquid crystal display device in one embodiment of the present invention.

FIG. 18A schematically illustrates the frequency of rewrites of image signals in the moving image region and the still image region in the examples in FIGS. 17A to 17C every frame period, for example, where the horizontal axis indicates time. In FIG. 18A, W indicates a period during which an image signal is rewritten, and H indicates a period during which the image signal is held. In addition, a period 1801 is one frame period; however, the period 1801 may be a different period.

As is clear from FIG. 18A, in the liquid crystal display device in Embodiment 1, in the case where differences of image signals between a series of frames are detected by the comparison circuit, i.e., in the case of the moving image region, image signals supplied to pixels are rewritten every frame period. Thus, in the moving image region, image signals are frequently rewritten. Further, in the liquid crystal display device in Embodiment 1, in the case where differences of image signals between a series of frames are not detected by the comparison circuit, in the case of the still image region, image signals supplied to pixels are rewritten only in a period during which the image signals are switched (the period 1801 in FIG. 18A), and the other periods correspond to periods during which the supplied image signals are held.

Figure 18B:
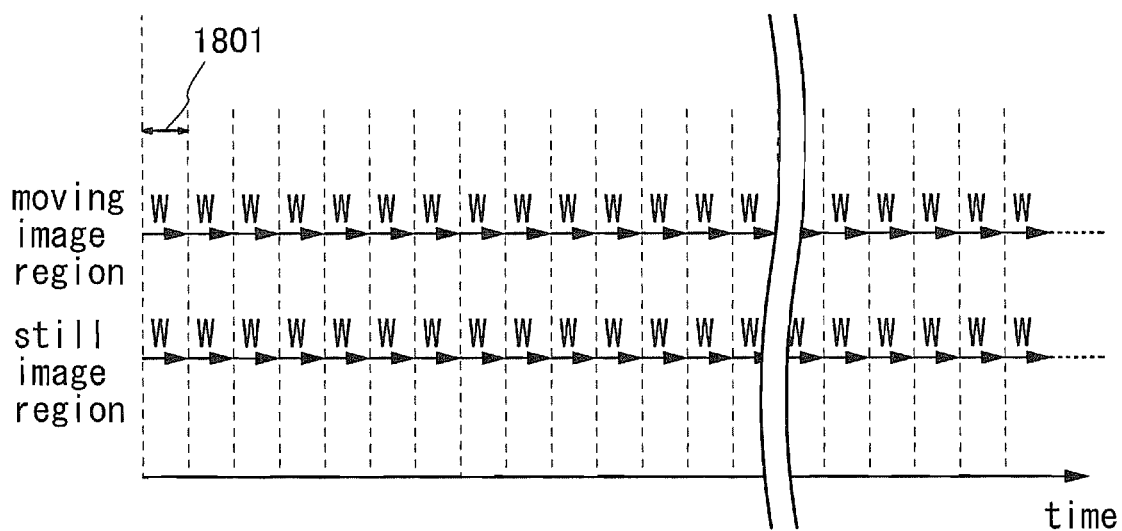

Note that FIG. 18B illustrates the case where image signals are periodically rewritten regardless of a moving image region and a still image region as in FIG. 18A for comparison. In order to display an image where a moving image region and a still image region are mixed, image signals are periodically rewritten in pixels.

As described above, in the still image region and a still image region in a partial moving image, frequent rewrites of image signals can be eliminated. Rewrites of image signals more than once might cause eyestrain. With a structure where the frequency of rewrites of image signals is reduced as described in this embodiment, eyestrain is reduced, which is advantageous.

As described above, in this embodiment, when thin film transistors including oxide semiconductors are provided in pixels, off-state current can be reduced. Therefore, it is possible to obtain a liquid crystal display device in which voltage can be held in a storage capacitor for a longer time and power consumption when a still image is displayed can be reduced.

This embodiment can be combined with any of the structures described in the other embodiments as appropriate.

Embodiment 5

In this embodiment, an example of a thin film transistor which can be applied to a liquid crystal display device disclosed in this specification is described.

One embodiment of a liquid crystal display device of this embodiment and a method for manufacturing the liquid crystal display device is described with reference to FIGS. 7A to 7E.

FIGS. 7A to 7E illustrate an example of a cross-sectional structure of a liquid crystal display device. Thin film transistors 410 and 420 in FIGS. 7A to 7E each have a kind of bottom-gate structure called a channel-etched structure and are also referred to as inverted-staggered thin film transistors. In FIGS. 7A to 7E, the thin film transistor 410 is a switching transistor and the thin film transistor 420 is a pixel transistor.

Although the thin film transistors 410 and 420 are described as single-gate thin film transistors, multi-gate thin film transistors each including a plurality of channel formation regions can be formed when needed.

Steps of forming the thin film transistors 410 and 420 over a substrate 400 are described below with reference to FIGS. 7A to 7E.

First, a conductive film is formed over the substrate 400 having an insulating surface. Then, gate electrode layers 401 and 451 are formed in a first photolithography process. Note that a resist mask may be formed by an inkjet method. When the resist mask is formed by an inkjet method, a photomask is not used; thus, manufacturing cost can be reduced.

Although there is no particular limitation on a substrate which can be used as the substrate 400 having an insulating surface, it is necessary that the substrate have at least heat resistance high enough to withstand heat treatment to be performed later. A glass substrate formed using barium borosilicate glass, aluminoborosilicate glass, or the like can be used In the case where the temperature of the heat treatment to be performed later is high, a glass substrate whose strain point is 730° C. or higher is preferably used. For the glass substrate, for example, a glass material such as aluminosilicate glass, aluminoborosilicate glass, or barium borosilicate glass is used.

Note that instead of the glass substrate, a substrate formed using an insulator, such as a ceramic substrate, a quartz substrate, or a sapphire substrate, may be used. Alternatively, crystallized glass or the like can be used.

An insulating film serving as a base film may be provided between the substrate 400 and the gate electrode layers 411 and 421. The base film has a function of preventing diffusion of an impurity element from the substrate 400, and can be formed to have a single-layer structure or a layered structure including one or more films selected from a silicon nitride film, a silicon oxide film, a silicon nitride oxide film, or a silicon oxynitride film.

The gate electrode layers 411 and 421 can be formed to have a single-layer structure or a layered structure including a metal material such as molybdenum, titanium, chromium, tantalum, tungsten, aluminum, copper, neodymium, or scandium; or an alloy material which contains the metal material as its main component.

As a two-layer structure of the gate electrode layers 411 and 421, for example, a two-layer structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, or a two-layer structure in which a titanium nitride layer and a molybdenum layer are stacked is preferable. As a three-layer structure, a stack of a tungsten layer or a tungsten nitride layer, an alloy of aluminum and silicon or an alloy of aluminum and titanium, and a titanium nitride layer or a titanium layer is preferable.

Then, a gate insulating layer 402 is formed over the gate electrode layers 411 and 421.

The gate insulating layer 402 can be formed to have a single-layer structure or a layered structure including a silicon oxide layer, a silicon nitride layer, a silicon oxynitride layer, a silicon nitride oxide layer, or an aluminum oxide layer by plasma-enhanced CVD, sputtering, or the like. For example, a silicon oxynitride layer may be formed using $SiH_4$, oxygen, and nitrogen as a deposition gas by plasma-enhanced CVD. Alternatively, a high-k material such as hafnium oxide ($HfO_x$) or tantalum oxide ($TaO_x$) can be used for the gate insulating layer. The thickness of the gate insulating layer 402 is 100 to 500 nm. In the case where the gate insulating layer 402 is formed to have a layered structure, a first gate insulating layer having a thickness of 50 to 200 nm and a second gate insulating layer having a thickness of 5 to 300 nm are stacked.

In this embodiment, as the gate insulating layer 402, a silicon oxynitride layer is formed to a thickness of 100 nm or less by plasma-enhanced CVD.

Further, as the gate insulating layer 402, a silicon oxynitride layer may be formed using a high-density plasma apparatus. Here, a high-density plasma apparatus refers to an apparatus which can realize a plasma density of $1 \times 10^{11}/cm^3$ or higher. For example, plasma is generated by application of a microwave power of 3 to 6 kW so that an insulating layer is formed.

A monosilane gas ($SiH_4$), nitrous oxide ($N_2O$), and a rare gas are introduced into a chamber as a source gas, and high-density plasma is generated at a pressure of 10 to 30 Pa so that an insulating layer is formed over a substrate having an insulating surface (e.g., a glass substrate). After that, the supply of a monosilane gas is stopped, and nitrous oxide ($N_2O$) and a rare gas are introduced without exposure to the air, so that plasma treatment may be performed on a surface of the insulating layer. The plasma treatment performed on the surface of the insulating layer by introduction of at least nitrous oxide ($N_2O$) and a rare gas is performed after the insulating layer is formed. The insulating layer formed through the above process is an insulating layer whose reliability can be secured to some extent even though it has small thickness, for example, a thickness less than 100 nm.

When the gate insulating layer 402 is formed, the flow ratio of the monosilane gas ($SiH_4$) to nitrous oxide ($N_2O$) which are introduced into the chamber is in the range of 1:10 to 1:200. In addition, as the rare gas which is introduced into the chamber, helium, argon, krypton, xenon, or the like can be used. In particular, argon, which is inexpensive, is preferably used.

In addition, since the insulating layer formed using the high-density plasma apparatus can have a uniform thickness, the insulating layer has excellent step coverage. Further, as for the insulating layer formed using the high-density plasma apparatus, the thickness of a thin film can be controlled precisely.

The film quality of the insulating layer formed through the above process is greatly different from that of an insulating layer formed using a conventional parallel plate PCVD apparatus. The etching rate of the insulating layer formed through the above process is lower than that of the insulating layer formed using the conventional parallel plate PCVD apparatus by 10% or more or 20% or more in the case where the etching rates with the same etchant are compared to each other. Thus, it can be said that the insulating layer formed using the high-density plasma apparatus is a dense layer.

An oxide semiconductor (a highly purified oxide semiconductor) which is made to be intrinsic (i-type) or substantially intrinsic in a later step is highly sensitive to an interface state and interface charge; thus, an interface between the oxide semiconductor and the gate insulating layer is important. Thus, the gate insulating layer (GI) which is in contact with the highly purified oxide semiconductor needs high quality. Therefore, high-density plasma-enhanced CVD using microwaves (2.45 GHz) is preferable because a dense high-quality insulating layer having high withstand voltage can be formed. This is because when the highly purified oxide semiconductor is closely in contact with the high-quality gate insulating layer, the interface state can be reduced and interface properties can be favorable. It is important that the gate insulating layer have lower interface state density with an oxide semiconductor and a favorable interface as well as having favorable film quality as a gate insulating layer.

Then, an oxide semiconductor film 430 is formed to a thickness of 2 to 200 nm over the gate insulating layer 402. The thickness of the oxide semiconductor film 430 is preferably 50 nm or less in order that the oxide semiconductor film be amorphous even when heat treatment for dehydration or dehydrogenation is performed after the oxide semiconductor film 430 is formed. When the thickness of the oxide semiconductor film is made small, crystallization can be suppressed when heat treatment is performed after the oxide semiconductor layer is formed.

Note that before the oxide semiconductor film 430 is formed by sputtering, dust on a surface of the gate insulating layer 402 is preferably removed by reverse sputtering in which an argon gas is introduced and plasma is generated. The reverse sputtering refers to a method in which, without application of voltage to a target side, an RF power source is used for application of voltage to a substrate side in an argon atmosphere and plasma is generated in the vicinity of the substrate so that a substrate surface is modified. Note that nitrogen, helium, or the like may be used instead of the argon atmosphere.

As the oxide semiconductor film 430, an In—Ga—Zn—O-based oxide semiconductor film, an In—Sn—O-based oxide semiconductor film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, a Sn—Zn—O-based oxide semiconductor film, an Al—Zn—O-based oxide semiconductor film, an In—O-based oxide semiconductor film, a Sn—O-based oxide semiconductor film, or a Zn—O-based oxide semiconductor film is used. In this embodiment, the oxide semiconductor film 430 is deposited by sputtering with the use of an In—Ga—Zn—O-based metal oxide target. A cross-sectional view at this stage corresponds to FIG. 7C. Alternatively, the oxide semiconductor film 430 can be deposited by sputtering in a rare gas (typically argon) atmosphere, an oxygen atmosphere, or an atmosphere including a rare gas (typically argon) and oxygen. In addition, in the case where sputtering is used, it is preferable to deposit the oxide semiconductor film 430 with the use of a target containing $SiO_2$ at 2 to 10 wt % such that Si, which inhibits crystallization, is contained in the oxide semiconductor film 430 in order to prevent an oxide semiconductor from being crystallized in heat treatment for dehydration or dehydrogenation which is performed in a later step.

Here, deposition is performed using a metal oxide target containing In, Ga, and Zn ($In_2O_3:Ga_2O_3:ZnO=1:1:1$ [mol %] and In:Ga:Zn=1:1:0.5 [at. %]). The deposition condition is set as follows: the distance between the substrate and the target is 100 mm; the pressure is 0.2 Pa; the direct current (DC) power is 0.5 kW; and the atmosphere is an atmosphere containing argon and oxygen (argon: oxygen=30 sccm:20 sccm and the flow rate ratio of oxygen is 40%). Note that it is preferable that pulsed direct-current (DC) power be used because powdered substances (also referred to as particles or dust) generated in deposition can be reduced and the film thickness can be uniform. The thickness of an In—Ga—Zn—O-based film is 5 to 200 nm. In this embodiment, as the oxide semiconductor film, a 20-nm-thick In—Ga—Zn—O-based film is deposited by sputtering with the use of an In—Ga—Zn—O-based metal oxide target. Alternatively, as the metal oxide target containing In, Ga, and Zn, a target having a composition ratio of In:Ga:Zn=1:1:1 (at. %) or a target having a composition ratio of In:Ga:Zn=1:1:2 (at. %) can be used.

Examples of sputtering include RF sputtering in which a high-frequency power source is used as a sputtering power source, DC sputtering, and pulsed DC sputtering in which a bias is applied in a pulsed manner. RF sputtering is mainly used in the case where an insulating film is deposited, and DC sputtering is mainly used in the case where a metal film is deposited.

In addition, there is also a multi-source sputtering apparatus in which a plurality of targets of different materials can be set. With the multi-source sputtering apparatus, films of different materials can be deposited to be stacked in the same chamber, or a film of plural kinds of materials can be deposited by electric discharge at the same time in the same chamber.

In addition, there are a sputtering apparatus provided with a magnet system inside the chamber and used for magnetron sputtering, and a sputtering apparatus used for ECR sputtering in which plasma generated with the use of microwaves is used without using glow discharge.

Further, as a deposition method using sputtering, reactive sputtering in which a target substance and a sputtering gas component are chemically reacted with each other during deposition to form a thin compound film thereof, or bias sputtering in which voltage is also applied to a substrate during deposition can be used.

Next, the oxide semiconductor film 430 is processed into an island-shaped oxide semiconductor layer in a second photolithography process. A resist mask used for forming the island-shaped oxide semiconductor layer may be formed by an inkjet method. When the resist mask is formed by an inkjet method, a photomask is not used; thus, manufacturing cost can be reduced.

Then, the oxide semiconductor layer is dehydrated or dehydrogenated. The temperature of first heat treatment for dehydration or dehydrogenation is higher than or equal to 400° C. and lower than or equal to 750° C., preferably higher than or equal to 400° C. and lower than the strain point of the substrate. Here, after the substrate is put in an electric furnace which is a kind of heat treatment apparatus and heat treatment is performed on the oxide semiconductor layer at 450° C. for one hour in a nitrogen atmosphere, water and hydrogen are prevented from being mixed into the oxide semiconductor layer by preventing the substrate from being exposed to the air; thus, oxide semiconductor layers 431 and 432 are obtained (see FIG. 7B).

Note that the heat treatment apparatus is not limited to an electric furnace, and may be provided with a device for heating an object to be processed by thermal conduction or thermal radiation from a heater such as a resistance heater. For example, an RTA (rapid thermal annealing) apparatus such as a GRTA (gas rapid thermal annealing) apparatus or an LRTA (lamp rapid thermal annealing) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus with which heat treatment is performed using a high-temperature gas. As the gas, an inert gas which does not react with an object to be processed by heat treatment, such as nitrogen or a rare gas such as argon, is used.

For example, as the first heat treatment, GRTA may be performed as follows. The substrate is transferred and put in an inert gas heated at a high temperature of 650 to 700° C., is heated for several minutes, and is transferred and taken out of the inert gas heated at the high temperature. GRTA enables high-temperature heat treatment in a short time.

Note that in the first heat treatment, it is preferable that water, hydrogen, and the like be not contained in nitrogen or a rare gas such as helium, neon, or argon. Further, the purity of nitrogen or a rare gas such as helium, neon, or argon which is introduced into the heat treatment apparatus is preferably 6N (99.9999%) or higher, more preferably 7N (99.99999%) or higher (that is, the impurity concentration is 1 ppm or lower, preferably 0.1 ppm or lower).

Further, the oxide semiconductor layer is crystallized and the crystal structure of the oxide semiconductor layer is changed into a microcrystalline structure or a polycrystalline structure depending on the condition of the first heat treatment or the material of the oxide semiconductor layer in some cases. For example, the oxide semiconductor layer might be crystallized to be a microcrystalline oxide semiconductor layer having a degree of crystallinity of 90% or more, or 80% or more. Further, depending on the condition of the first heat treatment or the material of the oxide semiconductor layer, the oxide semiconductor layer might become an amorphous oxide semiconductor layer containing no crystalline component. The oxide semiconductor layer might become an oxide semiconductor layer in which a microcrystalline portion (with a grain diameter of 1 to 20 nm, typically 2 to 4 nm) is mixed into an amorphous oxide semiconductor. In the case where high-temperature heat treatment is performed using RTA (e.g., GRTA or LRTA), a needle-like crystal in a longitudinal direction (in a film-thickness direction) might be generated on the surface side of the oxide semiconductor layer.

In addition, the first heat treatment for the oxide semiconductor layer can be performed on the oxide semiconductor film 430 before being processed into the island-shaped oxide semiconductor layer. In that case, the substrate is taken out from the heat apparatus after the first heat treatment, and then a photolithography process is performed.

The heat treatment for dehydration or dehydrogenation of the oxide semiconductor layer may be performed at any of the following timings: after the oxide semiconductor layer is formed; after a source electrode and a drain electrode are formed over the oxide semiconductor layer; and after a protective insulating film is formed over the source electrode and the drain electrode.

Further, in the case where an opening portion is formed in the gate insulating layer 402, the formation of the opening portion may be performed before or after the oxide semiconductor film 430 is dehydrated or dehydrogenated.

Note that the etching of the oxide semiconductor film here is not limited to wet etching, and dry etching may be employed.

As an etching gas used for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used.

Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching, parallel plate RIE (reactive ion etching) or ICP (inductively coupled plasma) etching can be used. In order to etch the film to have a desired shape, the etching conditions (the amount of electric power applied to a coil-shaped electrode, the amount of electric power applied to an electrode on a substrate side, the temperature of the electrode on the substrate side, and the like) are adjusted as appropriate.

As an etchant used for wet etching, a solution obtained by mixture of phosphoric acid, acetic acid, and nitric acid, an ammonia hydrogen peroxide mixture (a hydrogen peroxide solution at 31 wt %: ammonia water at 28 wt %: water=5:2:2), or the like can be used. Alternatively, ITO-07N (produced by KANTO CHEMICAL CO., INC.) may be used.

The etchant used in the wet etching is removed together with the etched material by cleaning. Waste liquid of the etchant including the removed material may be purified and the material contained in the waste liquid may be reused. When a material such as indium contained in the oxide semiconductor layer is collected from the waste liquid after the etching and reused, the resources can be efficiently used and cost can be reduced.

In order to etch the oxide semiconductor film to have a desired shape, the etching conditions (an etchant, etching time, temperature, and the like) are adjusted as appropriate depending on the material.

Next, a metal conductive film is formed over the gate insulating layer 402 and the oxide semiconductor layers 431 and 432. The metal conductive film may be formed by sputtering or vacuum evaporation. As the material of the metal conductive film, there are an element selected from Al, Cr, Cu, Ta, Ti, Mo, or W, an alloy containing the element, an alloy film containing some of the elements in combination, and the like. Alternatively, one or more materials selected from manganese, magnesium, zirconium, beryllium, and thorium may be used. Further, the metal conductive film may have a single-layer structure or a layered structure of two or more layers. For example, a single-layer structure of an aluminum film containing silicon, a two-layer structure in which a titanium film is stacked over an aluminum film, a three-layer structure in which a titanium film, an aluminum film, and a titanium film are stacked in that order, and the like can be given. Alternatively, a film, an alloy film, or a nitride film which contains Al and one or more elements selected from titanium (Ti), tantalum (Ta), tungsten (W), molybdenum (Mo), chromium (Cr), neodymium (Nd), or scandium (Sc) may be used.

When heat treatment is performed after the formation of the metal conductive film, it is preferable that the metal conductive film have heat resistance high enough to withstand the heat treatment.

Figure 7A:
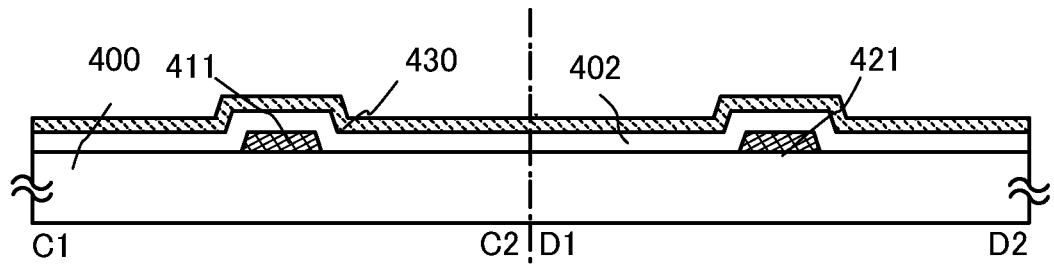
FIGS. 7A to 7E illustrate a liquid crystal display device in one embodiment of the present invention.
Figure 7B:
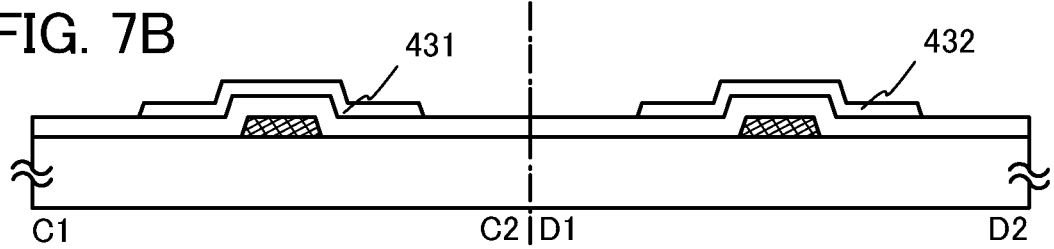
Figure 7C:
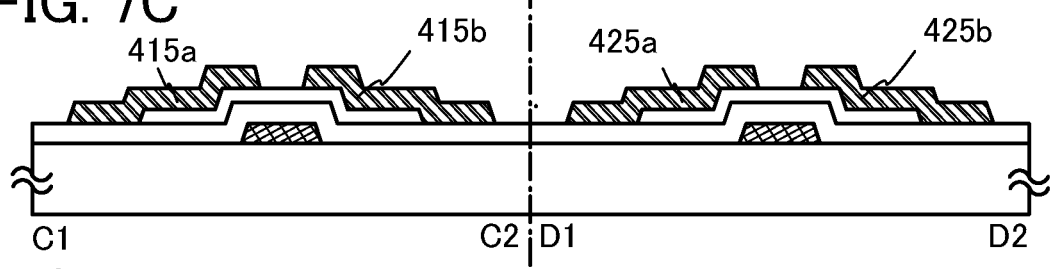
Figure 7D:
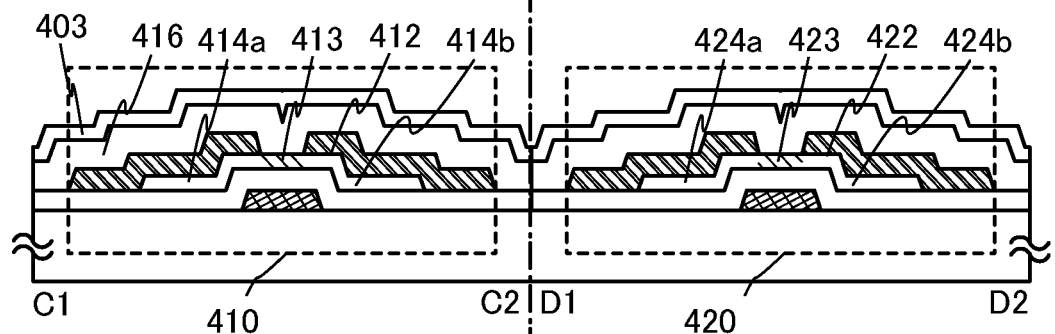

A resist mask is formed over the metal conductive film in a third photolithography process; a source electrode layer 415a, a drain electrode layer 415b, a source electrode layer 425a, and a drain electrode layer 425b are formed by selective etching; then, the resist mask is removed (see FIG. 7C).

Note that each material and etching conditions are adjusted as appropriate so that the oxide semiconductor layers 431 and 432 are not removed when the metal conductive film is etched.

In this embodiment, a Ti film is used as the metal conductive film, an In—Ga—Zn—O-based oxide is used for the oxide semiconductor layers 431 and 432, and an ammonia hydrogen peroxide solution (a mixture of ammonia, water, and a hydrogen peroxide solution) is used as an etchant.

Note that in the third photolithography process, only some of the oxide semiconductor layers 431 and 432 are etched so that oxide semiconductor layers having grooves (depressions) are formed in some cases. The resist mask used for forming the source electrode layer 415a, the drain electrode layer 415b, the source electrode layer 425a, and the drain electrode layer 425b may be formed by an inkjet method. When the resist mask is formed by an inkjet method, a photomask is not used; thus, manufacturing cost can be reduced.

In order to reduce the number of photomasks used in the photolithography processes and to reduce the number of processes, an etching process may be performed using a multi-tone mask which is an exposure mask through which light is transmitted to have a plurality of intensities. A resist mask formed using a multi-tone mask has a plurality of thicknesses and can be changed in shape by etching; therefore, the resist mask can be used in a plurality of etching processes for processing films into different patterns. Therefore, a resist mask corresponding to at least two or more kinds of different patterns can be formed by one multi-tone mask. Thus, the number of exposure masks and the number of corresponding photolithography processes can be reduced, so that the process can be simplified.

Next, plasma treatment is performed using a gas such as $N_2O$, $N_2$, or Ar. With this plasma treatment, absorbed water and the like which attach to a surface of the oxide semiconductor layer exposed are removed. Alternatively, plasma treatment may be performed using a mixture gas of oxygen and argon.

After the plasma treatment, an oxide insulating layer 416 which serves as a protective insulating film and is in contact with part of the oxide semiconductor layer is formed without exposure to the air.

The oxide insulating layer 416 can be formed to have a thickness of at least 1 nm or more by a method by which an impurity such as water or hydrogen is not mixed into the oxide insulating layer 416, such as sputtering, as appropriate. When hydrogen is contained in the oxide insulating layer 416, entry of hydrogen to the oxide semiconductor layers or abstraction of oxygen in the oxide semiconductor layers by hydrogen is caused, so backchannels of the oxide semiconductor layers have lower resistance (have n-type conductivity) and parasitic channels are formed. Therefore, it is important that the amount of hydrogen used in deposition is as small as possible in order that the oxide insulating layer 416 contain as little hydrogen as possible.

In this embodiment, a 200-nm-thick silicon oxide film is deposited as the oxide insulating layer 416 by sputtering. The substrate temperature at the time of deposition is in the range of from room temperature to 300° C., and 100° C. in this embodiment. The silicon oxide film can be deposited by sputtering in a rare gas (typically argon) atmosphere, an oxygen atmosphere, or an atmosphere including a rare gas (typically argon) and oxygen. Further, a silicon oxide target or a silicon target can be used as a target. For example, silicon oxide can be deposited by using a silicon target in an atmosphere including oxygen and nitrogen by sputtering. The oxide insulating layer 416 which is formed in contact with the oxide semiconductor layers whose resistance is lowered is formed using an inorganic insulating film which does not include impurity such as moisture, a hydrogen ion, or OH⁻ and blocks entry of such an impurity from the outside, typically, a silicon oxide film, a silicon nitride oxide film, an aluminum oxide film, or an aluminum oxynitride film.

Next, second heat treatment (preferably at 200 to 400° C., for example, 250 to 350° C.) is performed in an inert gas atmosphere or an oxygen gas atmosphere. For example, the second heat treatment is performed at 250° C. for one hour in a nitrogen atmosphere. Through the second heat treatment, some of the oxide semiconductor layers (channel formation regions) are heated while being in contact with the oxide insulating layer 416.

Through the above steps, after the heat treatment for dehydration or dehydrogenation is performed on the deposited oxide semiconductor film in order to lower the resistance of the oxide semiconductor film, part of the oxide semiconductor film is selectively made to be in an oxygen excess state. Accordingly, a channel formation region 413 overlapping with the gate electrode layer 411 becomes intrinsic, and a high-resistant source region 414a which is in contact with the source electrode layer 415a and a high-resistant drain region 414b which is in contact with the drain electrode layer 415b are formed in a self-aligning manner. Through the above steps, the thin film transistor 410 is formed. Similarly, a channel formation region 423 overlapping with the gate electrode layer 421 becomes intrinsic, and a high-resistant source region 424a which is in contact with the source electrode layer 425a and a high-resistant drain region 424b which is in contact with the drain electrode layer 425b are formed in a self-aligning manner. Through the above steps, the thin film transistor 420 is formed.

In a bias temperature test (BT test) at 85° C. and 2×10⁶ V/cm for 12 hours, if an impurity has been added to an oxide semiconductor, the bond between the impurity and the main component of the oxide semiconductor is broken by a high electric field (B: bias) and high temperature (T: temperature), so that a generated dangling bond induces a shift in the threshold voltage ($V_{th}$). As a countermeasure against this, the impurity in the oxide semiconductor, especially, hydrogen, water, or the like is removed as much as possible so that a high-quality dense insulating film having high withstand voltage is formed by the high-density plasma-enhanced CVD and the properties of an interface with the oxide semiconductor are improved. Accordingly, it is possible to obtain a thin film transistor which is stable even when the BT test is performed.

Further, heat treatment may be performed at 100 to 200° C. for 1 to 30 hours in an air atmosphere. In this embodiment, the heat treatment is performed at 150° C. for 10 hours. This heat treatment may be performed at a fixed heating temperature. Alternatively, the following change in the heating temperature may be conducted plural times repeatedly: the heating temperature is increased from room temperature to a temperature of 100 to 200° C. and then decreased to room temperature. Further, this heat treatment may be performed under a reduced pressure before the formation of the oxide insulating layer. When the heat treatment is performed under a reduced pressure, the heating time can be shortened. Through this heat treatment, hydrogen is introduced from the oxide semiconductor layer to the oxide insulating layer; thus, a normally-off thin film transistor can be obtained. Thus, the reliability of a liquid crystal display device can be improved.

Note that by the formation of the high-resistant drain regions 414b and 424b in the oxide semiconductor layers overlapping with the drain electrode layers 415b and 425b (and the source electrode layers 415a and 425a), reliability of the thin film transistors can be improved. Specifically, by the formation of the high-resistant drain regions 414b and 424b, a structure can be obtained in which conductivity can be varied stepwise from the drain electrode layers 415b and 425b to the high-resistant drain regions 414b and 424b and the channel formation regions 413 and 423. Therefore, in the case where operation is performed with the drain electrode layers 415b and 425b connected to a wiring for supplying a high power supply potential VDD, the high-resistant drain regions serve as buffers and a high electric field is not applied locally even if the high electric field is applied between the gate electrode layer 411 and the drain electrode layer 415b and between the gate electrode layer 421 and the drain electrode layer 425b; thus, the withstand voltage of the thin film transistors can be increased.

Further, the high-resistant source region and the high-resistant drain region in the oxide semiconductor layer are formed in the entire region in a thickness direction in the case where the oxide semiconductor layer is as thin as 15 nm or less. In the case where the oxide semiconductor layer is as thick as 30 to 50 nm, the high-resistant source region and the high-resistant drain region where parts of the oxide semiconductor layer, i.e., regions which are in contact with the source electrode layer and the drain electrode layer, and the vicinity thereof have lower resistance are formed, and a region of the oxide semiconductor layer that is near the gate insulating layer can be intrinsic.

A protective insulating layer may be formed over the oxide insulating layer 416. For example, a silicon nitride film is formed by RF sputtering. Since RF sputtering has high productivity, it is preferably used as a deposition method of the protective insulating layer. The protective insulating layer is formed using an inorganic insulating film which does not contain an impurity such as moisture, a hydrogen ion, and OW and blocks entry of such an impurity from the outside, typically a silicon nitride film, an aluminum nitride film, a silicon nitride oxide film, or an aluminum oxynitride film. In this embodiment, as the protective insulating layer, a protective insulating layer 403 is formed using a silicon nitride film (see FIG. 7D).

Figure 7E:
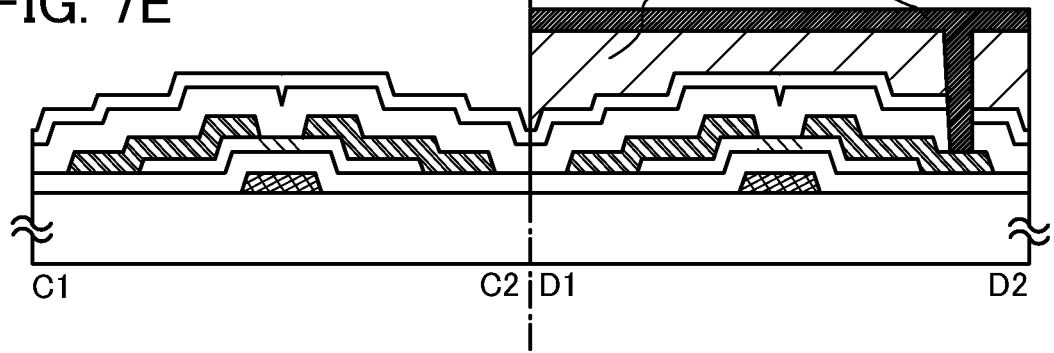

A planarization insulating layer for planarization may be provided over the protective insulating layer 403. As illustrated in FIG. 7E, a planarization insulating layer 404 is formed over the protective insulating layer 403 in the thin film transistor 420.

The planarization insulating layer 404 can be formed using a heat-resistant organic material such as polyimide, acrylic, benzocyclobutene, polyamide, or epoxy. Other than such organic materials, it is possible to use a low-dielectric constant material (a low-k material), a siloxane-based resin, PSG (phosphosilicate glass), BPSG (borophosphosilicate glass), or the like. Note that the planarization insulating layer 44 may be formed by stacking a plurality of insulating films formed using these materials.

Note that a siloxane-based resin corresponds to a resin including a Si—O—Si bond formed using a siloxane-based material as a starting material. The siloxane-based resin may include an organic group (e.g., an alkyl group or an aryl group) as a substituent. Further, the organic group may include a fluoro group.

There is no particular limitation on the method for forming the planarization insulating layer 404. The planarization insulating layer 404 can be formed, depending on the material, by a method such as sputtering, an SOG method, a spin coating method, a dipping method, a spray coating method, or a droplet discharge method (e.g., an inkjet method, screen printing, or offset printing), or a tool such as a doctor knife, a roll coater, a curtain coater, or a knife coater.

Next, a resist mask is formed in a fourth photolithography process and some of the oxide insulating layer 416, the protective insulating layer 403, and the planarization insulating layer 404 are removed by selective etching, so that an opening which reaches the drain electrode layer 425*b* is formed.

Then, a light-transmitting conductive film is formed. The light-transmitting conductive film is formed using indium oxide ($In_2O_3$), an alloy of indium oxide and tin oxide ($In_2O_3$—$SnO_2$, abbreviated as ITO), or the like by sputtering, vacuum evaporation, or the like. Alternatively, the light-transmitting conductive film may be formed using an Al—Zn—O-based film containing nitrogen, that is, an Al—Zn—O—N-based film, a Zn—O-based film containing nitrogen, or a Sn—Zn—O-based film containing nitrogen. Note that the composition ratio (at. %) of zinc in the Al—Zn—O—N-based film is less than or equal to 47 at. % and is higher than that of aluminum in the film; the composition ratio (at. %) of aluminum in the film is higher than that of nitrogen in the film. Such a material is etched with a hydrochloric acid-based solution. However, since a residue is easily generated particularly in etching ITO, an alloy of indium oxide and zinc oxide ($In_2O_3$—ZnO) may be used in order to improve etching processability.

Note that the unit of the composition ratio in the light-transmitting conductive film is atomic percent (at. %), and the composition ratio is evaluated by analysis using an electron probe X-ray microanalyzer (EPMA).

Next, a resist mask is formed in a fifth photolithography process; unnecessary portions of the light-transmitting conductive film are removed by etching so that a pixel electrode 427 is formed; and the resist mask is removed (see FIG. 7E).

In this embodiment, the step of forming the opening in the gate insulating layer is performed in the same photolithography process as the oxide insulating layer and the protective insulating layer; however, the step of forming the opening in the gate insulating layer may be performed in a different step. In this case, the photography process corresponds to a sixth step.

With a combination of a liquid crystal display device including the thin film transistor having the oxide semiconductor layer described in this embodiment and the structure described in Embodiment 1, power consumption can be reduced and image distortion can be suppressed when a still image is displayed.

This embodiment can be combined with any of the other embodiments as appropriate.

Embodiment 6

In this embodiment, another example of a thin film transistor which can be applied to a liquid crystal display device disclosed in this specification is described.

One embodiment of a liquid crystal display device of this embodiment and a method for manufacturing the liquid crystal display device is described with reference to FIGS. 8A to 8E.

Although thin film transistors 240 and 260 are described as single-gate thin film transistors, multi-gate thin film transistors each including a plurality of channel formation regions can be formed when needed.

Steps of forming the thin film transistors 240 and 260 over a substrate 200 are described below with reference to FIGS. 8A to 8E.

First, a conductive film is formed over the substrate 200 having an insulating surface. Then, gate electrode layers 241 and 261 are formed in a first photolithography process. In this embodiment, as the gate electrode layers 241 and 261, a 150-nm-thick tungsten film is formed by sputtering.

Then, a gate insulating layer 292 is formed over the gate electrode layers 241 and 261. In this embodiment, as the gate insulating layer 292, a silicon oxynitride layer is formed to a thickness of 100 nm or less by plasma-enhanced CVD.

Figure 8A:
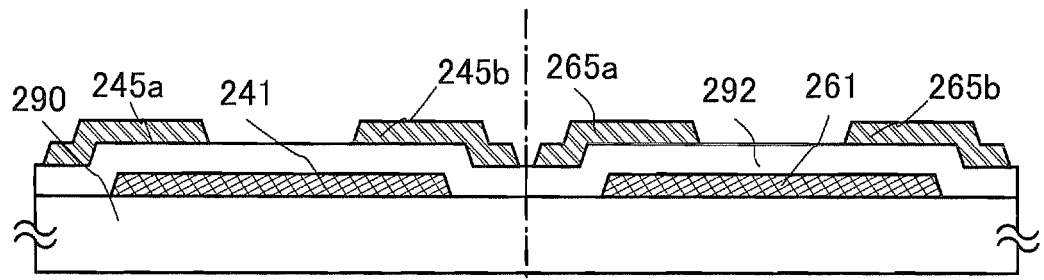
FIGS. 8A to 8E illustrate a liquid crystal display device in one embodiment of the present invention.

Next, a metal conductive film is formed over the gate insulating layer 292; a resist mask is formed over the metal conductive film in a second photolithography process; source electrode layers 245*a* and 265*a* and drain electrode layers 245*b* and 265*b* are formed by selective etched; then, the resist mask is removed (see FIG. 8A).

Figure 8B:
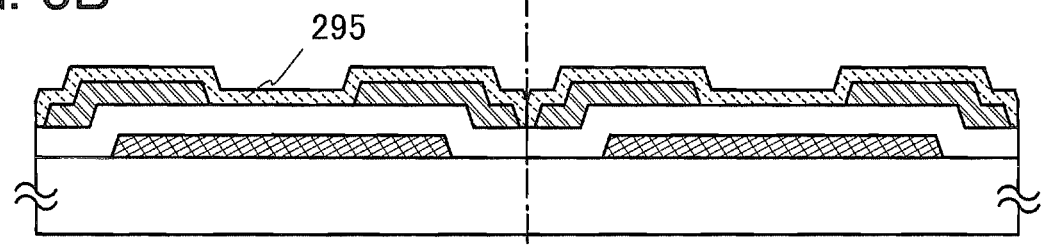
Figure 8C:
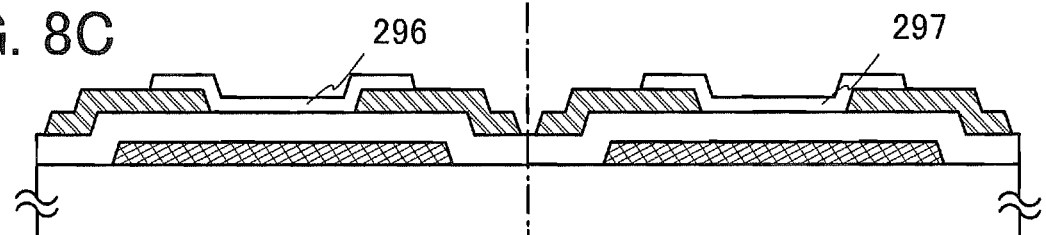
Figure 8D:
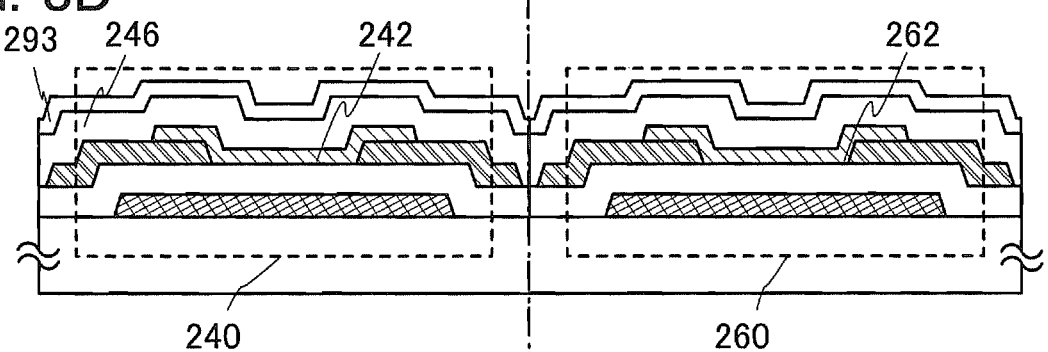

Then, an oxide semiconductor film 295 is formed (see FIG. 8B). In this embodiment, the oxide semiconductor film 295 is formed by sputtering with the use of an In—Ga—Zn—O-based metal oxide target. The oxide semiconductor film 295 is processed into an island-shaped oxide semiconductor layer in a third photolithography process.

Then, the oxide semiconductor layer is dehydrated or dehydrogenated. The temperature of first heat treatment for dehydration or dehydrogenation is higher than or equal to 400° C. and lower than or equal to 750° C., preferably higher than or equal to 400° C. and lower than the strain point of the substrate. Here, after the substrate is put in an electric furnace which is a kind of heat treatment apparatus and heat treatment is performed on the oxide semiconductor layer at 450° C. for one hour in a nitrogen atmosphere, water and hydrogen are prevented from being mixed into the oxide semiconductor layer by preventing the substrate from being exposed to the air; thus, oxide semiconductor layers 296 and 297 are obtained (see FIG. 8C).

For example, as the first heat treatment, GRTA may be performed as follows. The substrate is transferred and put in an inert gas heated at a high temperature of 650 to 700° C., is heated for several minutes, and is transferred and taken out of the inert gas heated at the high temperature. GRTA enables high-temperature heat treatment in a short time.

An oxide insulating layer 246 which serves as a protective insulating film formed in contact with the oxide semiconductor layers 296 and 297 is formed.

The oxide insulating layer 246 can be formed to have a thickness of at least 1 nm or more by a method by which an impurity such as water or hydrogen is not mixed into the oxide insulating layer 246, such as sputtering, as appropriate. When hydrogen is contained in the oxide insulating layer 246, entry of hydrogen to the oxide semiconductor layers or abstraction of oxygen in the oxide semiconductor layers by hydrogen is caused, so backchannels of the oxide semiconductor layers have lower resistance (have n-type conductivity) and parasitic channels are formed. Therefore, it is important that the amount of hydrogen used in deposition is as small as possible in order that the oxide insulating layer 246 contain as little hydrogen as possible.

In this embodiment, a 200-nm-thick silicon oxide film is deposited as the oxide insulating layer 246 by sputtering. The substrate temperature at the time of deposition is in the range of from room temperature to 300° C., and 100° C. in this embodiment. The silicon oxide film can be deposited by sputtering in a rare gas (typically argon) atmosphere, an oxygen atmosphere, or an atmosphere including a rare gas (typically argon) and oxygen. Further, a silicon oxide target or a silicon target can be used as a target. For example, silicon oxide can be deposited by using a silicon target in an atmosphere including oxygen and nitrogen by sputtering.

The oxide insulating layer 246 which is formed in contact with the oxide semiconductor layers whose resistance is lowered is formed using an inorganic insulating film which does not include impurity such as moisture, a hydrogen ion, or OH⁻ and blocks entry of such an impurity from the outside, typically, a silicon oxide film, a silicon nitride oxide film, an aluminum oxide film, or an aluminum oxynitride film.

Next, second heat treatment (preferably at 200 to 400° C., for example, 250 to 350° C.) is performed in an inert gas atmosphere or an oxygen gas atmosphere. For example, the second heat treatment is performed at 250° C. for one hour in a nitrogen atmosphere. Through the second heat treatment, some of the oxide semiconductor layers (channel formation regions) are heated while being in contact with the oxide insulating layer 246.

Through the above steps, after the heat treatment for dehydration or dehydrogenation is performed on the deposited oxide semiconductor film in order to lower the resistance of the oxide semiconductor film, the oxide semiconductor film is made to be in an oxygen excess state. Accordingly, intrinsic (i-type) oxide semiconductor layers 242 and 262 are formed. Through the above steps, the thin film transistors 240 and 260 are formed.

Further, heat treatment may be performed at 100 to 200° C. for 1 to 30 hours in an air atmosphere. In this embodiment, the heat treatment is performed at 150° C. for 10 hours. This heat treatment may be performed at a fixed heating temperature. Alternatively, the following change in the heating temperature may be conducted plural times repeatedly: the heating temperature is increased from room temperature to a temperature of 100 to 200° C. and then decreased to room temperature. Further, this heat treatment may be performed under a reduced pressure before the formation of the oxide insulating layer. When the heat treatment is performed under a reduced pressure, the heating time can be shortened. Through this heat treatment, hydrogen is introduced from the oxide semiconductor layer to the oxide insulating layer; thus, a normally-off thin film transistor can be obtained. Thus, the reliability of a liquid crystal display device can be improved.

A protective insulating layer may be formed over the oxide insulating layer 246. For example, a silicon nitride film is formed by RF sputtering. In this embodiment, as the protective insulating layer, a protective insulating layer 293 is formed using a silicon nitride film (see FIG. 8D).

A planarization insulating layer for planarization may be provided over the protective insulating layer 293. In this embodiment, as illustrated in FIG. 8E, a planarization insulating layer 294 is formed over the protective insulating layer 293 in the thin film transistor 260.

Next, a resist mask is formed in a fourth photolithography process and some of the planarization insulating layer 294, the protective insulating layer 293, and the oxide insulating layer 246 are removed by selective etching, so that an opening which reaches the drain electrode layer 265*b* is formed.

Figure 8E:
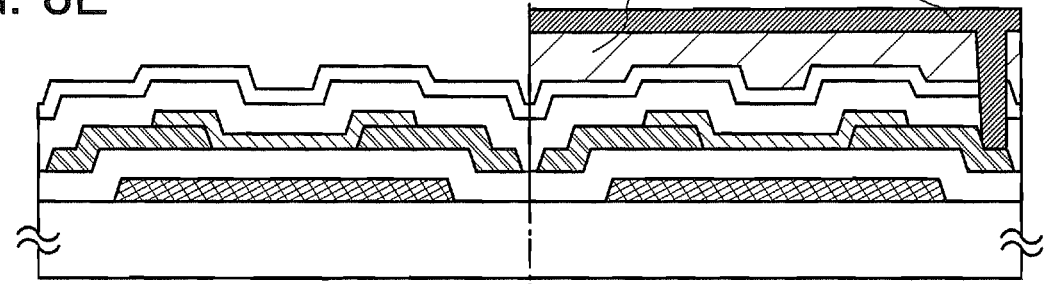

Next, a light-transmitting conductive film is formed; a resist mask is formed in a fifth photolithography process; unnecessary portions of the light-transmitting conductive film are removed by etching so that a pixel electrode 267 is formed; and the resist mask is removed (see FIG. 8E).

In this embodiment, the step of forming the opening in the gate insulating layer is performed in the same photolithography process as the oxide insulating layer and the protective insulating layer; however, the step of forming the opening in the gate insulating layer may be performed in a different step. In this case, the photography process corresponds to a sixth step.

With a combination of a liquid crystal display device including the thin film transistor having the oxide semiconductor layer described in this embodiment and the structure described in Embodiment 1, power consumption can be reduced in displaying a still image.

This embodiment can be combined with any of the other embodiments as appropriate.

Embodiment 7

In this embodiment, an example of a thin film transistor which can be applied to a liquid crystal display device disclosed in this specification is described.

Figure 9:
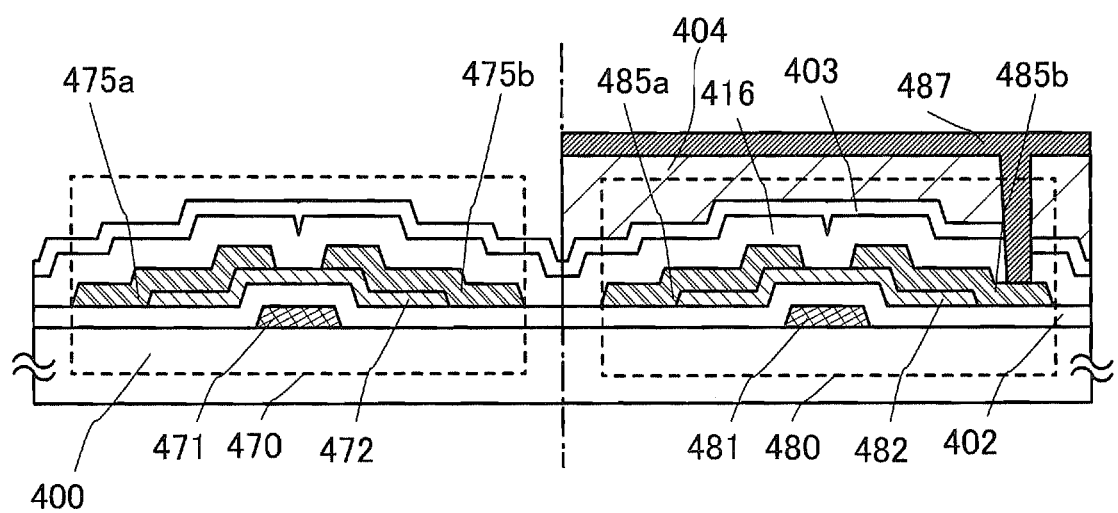
FIG. 9 illustrates a liquid crystal display device in one embodiment of the present invention.

In this embodiment, an example of a thin film transistor whose manufacturing process is partly different from that of Embodiment 5 is described with reference to FIG. 9. Since FIG. 9 is the same as FIGS. 7A to 7E except for part of the process, the same portions are denoted by the same reference numerals and detailed description of the same portions is omitted.

Gate electrode layers 471 and 481 are formed over the substrate 400 and the gate insulating layer 402 is stacked thereover.

Next, an oxide semiconductor film is formed and processed into an island-shaped oxide semiconductor layer in a photolithography process.

Then, the oxide semiconductor layer is dehydrated or dehydrogenated. The temperature of first heat treatment for dehydration or dehydrogenation is 400 to 750° C., preferably 425 to 750° C. Note that in the case where the temperature of the first heat treatment is 425° C. or higher, the heat treatment time may be one hour or less. In the case where the temperature of the first heat treatment is lower than 425° C., the heat treatment time is longer than one hour. Here, after the substrate is put in an electric furnace which is a kind of heat treatment apparatus and the oxide semiconductor layer is subjected to heat treatment in a nitrogen atmosphere, water or hydrogen is prevented from being mixed into the oxide semiconductor layer by preventing the substrate from being exposed to the air; thus, the oxide semiconductor layer is obtained. After that, a high-purity oxygen gas, a high-purity $N_2O$ gas, or ultra-dry air (having a dew point of −40° C. or lower, preferably −60° C. or lower) is introduced into the same furnace and cooling is performed. It is preferable that water, hydrogen, or the like be not contained in the oxygen gas or the $N_2O$ gas. Alternatively, the purity of the oxygen gas or the $N_2O$ gas which is introduced into the heat treatment apparatus is preferably 6N (99.9999%) or higher, more preferably 7N (99.99999%) or higher (that is, the impurity concentration in the oxygen gas or the $N_2O$ gas is 1 ppm or lower, preferably 0.1 ppm or lower).

Note that the heat treatment apparatus is not limited to an electric furnace. For example, an RTA (rapid thermal annealing) apparatus such as a GRTA (gas rapid thermal annealing) apparatus or an LRTA (lamp rapid thermal annealing) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. In addition, the LRTA apparatus may be provided with not only a lamp but also a device for heating an object to be processed by thermal conduction or thermal radiation from a heater such as a resistance heater. GRTA is a method for performing heat treatment with the use of a high-temperature gas. As the gas, an inert gas which does not react with an object to be processed by heat treatment, such as nitrogen or a rare gas such as argon, is used. Heat treatment may be performed at 600 to 750° C. for several minutes by RTA.

In addition, after the first heat treatment for dehydration or dehydrogenation, heat treatment may be performed at 200 to 400° C., preferably 200 to 300° C. in an oxygen gas atmosphere or an $N_2O$ gas atmosphere.

Further, the first heat treatment for the oxide semiconductor layer can be performed on the oxide semiconductor film before being processed into the island-shaped oxide semiconductor layer. In that case, the substrate is taken out from the heat apparatus after the first heat treatment, and then a photolithography process is performed.

The entire oxide semiconductor film is made to be in an oxygen excess state through the above steps; thus, the oxide semiconductor film has higher resistance, that is, the oxide semiconductor film becomes intrinsic. Accordingly, oxide semiconductor layers 472 and 482 whose entire regions have i-type conductivity are formed.

Next, a resist mask is formed over the oxide semiconductor layers 472 and 482 in a photolithography process; source electrode layers 475*a* and 485*a* and drain electrode layers 475*b* and 485*b* are formed by selective etching; and an oxide insulating layer 416 is formed by sputtering. Through the above steps, thin film transistors 470 and 480 can be formed.

Next, in order to reduce variation in electrical characteristics of the thin film transistors, heat treatment (preferably at higher than or equal to 150° C. and lower than 350° C.) may be performed in an inert gas atmosphere or a nitrogen gas atmosphere. For example, the heat treatment is performed at 250° C. for one hour in a nitrogen atmosphere.

Further, heat treatment may be performed at 100 to 200° C. for 1 to 30 hours in an air atmosphere. In this embodiment, the heat treatment is performed at 150° C. for 10 hours. This heat treatment may be performed at a fixed heating temperature. Alternatively, the following change in the heating temperature may be conducted plural times repeatedly: the heating temperature is increased from room temperature to a temperature of 100 to 200° C. and then decreased to room temperature. Further, this heat treatment may be performed under a reduced pressure before the formation of the oxide insulating layer. When the heat treatment is performed under a reduced pressure, the heating time can be shortened. Through this heat treatment, hydrogen is introduced from the oxide semiconductor layer to the oxide insulating layer; thus, a normally-off thin film transistor can be obtained. Thus, the reliability of a liquid crystal display device can be improved.

The protective insulating layer 403 is formed over the oxide insulating layer 416. In this embodiment, the protective insulating layer 403 is formed using a silicon nitride film as a protective insulating layer.

A planarization insulating layer for planarization may be provided over the protective insulating layer 403. In this embodiment, as illustrated in FIG. 9, the planarization insulating layer 404 is formed over the protective insulating layer 403 in the thin film transistor 480.

Next, a resist mask is formed in a photolithography process and some of the planarization insulating layer 404, the protective insulating layer 403, and the oxide insulating layer 416 are removed by selective etching, so that an opening which reaches the drain electrode layer 485*b* is formed.

Next, a light-transmitting conductive film is formed; a resist mask is formed in a photolithography process; unnecessary portions of the light-transmitting conductive film are removed by etching so that a pixel electrode 417 is formed; and the resist mask is removed (see FIG. 9).

With a combination of the liquid crystal display device including the thin film transistor having the oxide semiconductor layer described in this embodiment and the structure described in Embodiment 1, power consumption can be reduced in displaying a still image.

This embodiment can be combined with any of the other embodiments as appropriate.

Embodiment 8

In this embodiment, examples of electronic devices each including the liquid crystal display device described in the above embodiment are described.

Figure 10A:
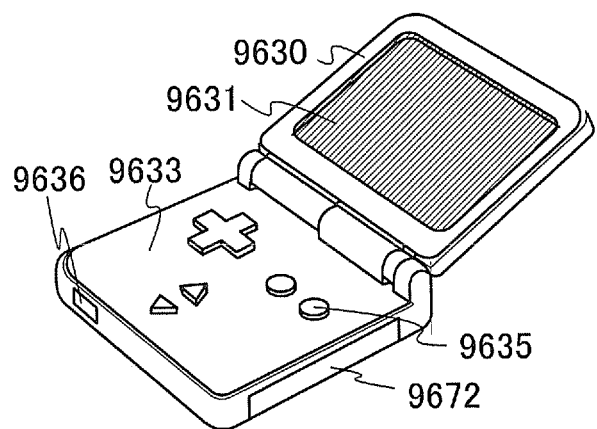
FIGS. 10A to 10C illustrate electronic devices in one embodiment of the present invention.

FIG. 10A shows a portable game machine, which can include a housing 9630, a display portion 9631, a speaker 9633, operation keys 9635, a connection terminal 9636, a recording medium reading portion 9672, and the like. The portable game machine illustrated in FIG. 10A can have a function of reading a program or data stored in a recording medium to display it on the display portion, a function of sharing information with another portable game machine by wireless communication, and the like. Note that the functions of the portable game machine illustrated in FIG. 10A are not limited to those described above, and the portable game machine can have a variety of functions.

Figure 10B:
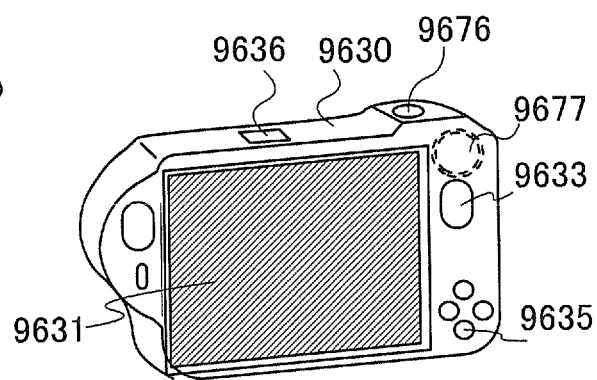

FIG. 10B illustrates a digital camera, which can include the housing 9630, the display portion 9631, the speaker 9633, the operation keys 9635, the connection terminal 9636, a shutter button 9676, an imaging reception portion 9677, and the like. The digital camera having a television reception function that is illustrated in FIG. 10B can have a function of photographing a still image and a moving image, a function of automatically or manually correcting the photographed image, a function of obtaining a variety of information from an antenna, a function of displaying the photographed image or the information obtained from the antenna on the display portion, and the like. Note that the functions of the digital camera having the television reception function that is illustrated in FIG. 10B are not limited to those described above, and the digital camera can have a variety of functions.

Figure 10C:
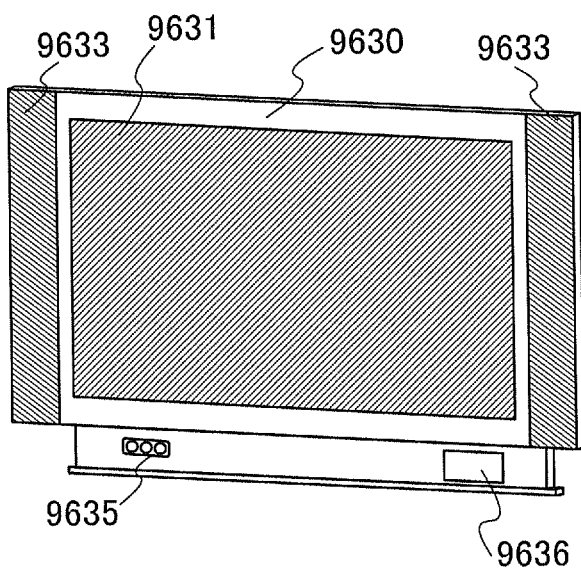

FIG. 10C illustrates a television receiver, which can include the housing 9630, the display portion 9631, the speakers 9633, the operation keys 9635, the connection terminal 9636, and the like. The television receiver illustrated in FIG. 10C can have a function of processing a radio wave for television and converting the radio wave into an image signal, a function of processing the image signal and converting the image signal into a signal which is suitable for display, a function of converting a frame frequency of the image signal, and the like. Note that the functions of the television receiver illustrated in FIG. 10C are not limited to those described above, and the television receiver can have a variety of functions.

Figure 11A:
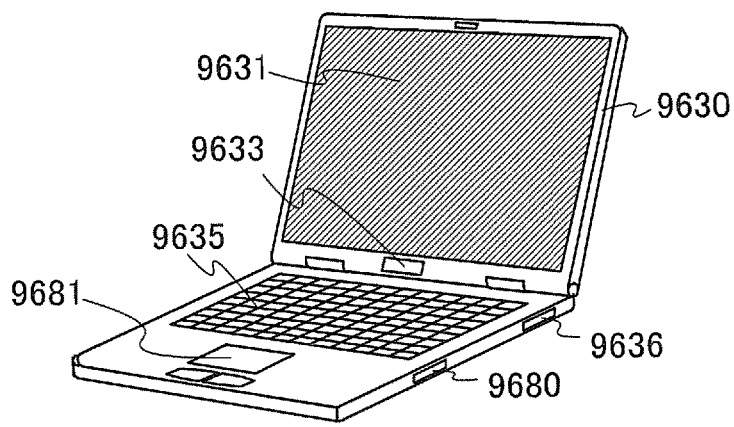
FIGS. 11A to 11C illustrate electronic devices in one embodiment of the present invention.

FIG. 11A illustrates a computer, which can include the housing 9630, the display portion 9631, the speaker 9633, the operation keys 9635, the connection terminal 9636, a pointing device 9681, an external connection port 9680, and the like. The computer illustrated in FIG. 11A can have a function of displaying various kinds of information (e.g., a still image, a moving image, and a text image) on the display portion, a function of controlling processing by various kinds of software (programs), a communication function such as wireless communication or wired communication, a function of being connected to various computer networks with the communication function, a function of transmitting or receiving a variety of data with the communication function, and the like. Note that the functions of the computer illustrated in FIG. 11A are not limited to those described above, and the computer can have a variety of functions.

Figure 11B:
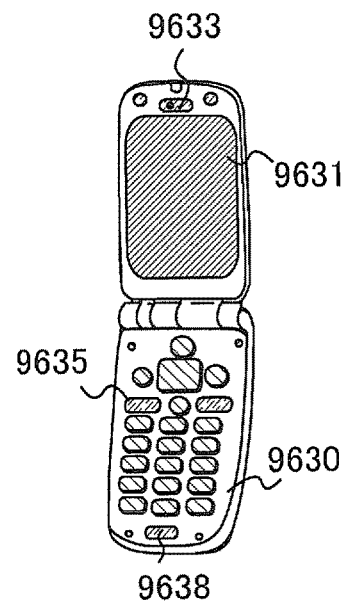

FIG. 11B illustrates a mobile phone, which can include the housing 9630, the display portion 9631, the speaker 9633, the operation keys 9635, a microphone 9638, the external connection port 9680, and the like. The mobile phone illustrated in FIG. 11B can have a function of displaying various kinds of information (e.g., a still image, a moving image, and a text image), a function of displaying a calendar, a date, the time, or the like on the display portion, a function of operating or editing the information displayed on the display portion, a function of controlling processing by various kinds of software (programs), and the like. Note that the functions of the mobile phone illustrated in FIG. 11B are not limited to those described above, and the mobile phone can have a variety of functions.

Figure 11C:
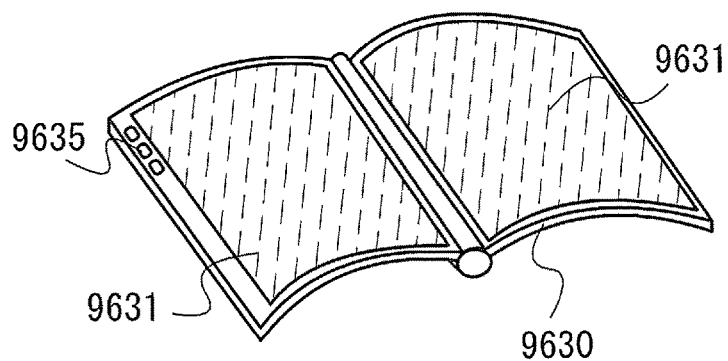

FIG. 11C illustrates electronic paper (also referred to as an e-book or an e-book reader), which can include the housing 9630, the display portion 9631, the operation keys 9635, and the like. The electronic paper illustrated in FIG. 11C can have a function of displaying various kinds of information (e.g., a still image, a moving image, and a text image), a function of displaying a calendar, a date, the time, or the like on the display portion, a function of operating or editing the information displayed on the display portion, a function of controlling processing by various kinds of software (programs), and the like. Note that the functions of the electronic paper illustrated in FIG. 11C are not limited to those described above, and the electronic paper can have a variety of functions.

In the electronic devices described in this embodiment, power consumption can be reduced when a still image is displayed.

This embodiment can be combined with any of the structures described in the other embodiments as appropriate.

This application is based on Japanese Patent Application serial no. 2009-272545 filed with Japan Patent Office on Nov. 30, 2009 and Japanese Patent Application serial no. 2009-279003 filed with Japan Patent Office on Dec. 8, 2009, the entire contents of which are hereby incorporated by reference.

The invention claimed is:

1. A display device comprising:
a plurality of pixels each comprising a transistor comprising an oxide semiconductor in a channel formation region,
wherein the oxide semiconductor comprises In, Ga and Zn,
wherein the display device is configured to display a still image with a refresh rate less than 60 Hz, and
wherein an off-current of the transistor is less than or equal to $1 \times 10^{-12}$ A when voltage between a drain and a source of the transistor is 10V.

2. The display device according to claim 1, wherein the display device is a liquid crystal display device.

3. The display device according to claim 1,
wherein each of the plurality of pixels comprises a liquid crystal element comprising a liquid crystal material whose specific resistance is $1 \times 10^{13}$ Ω·cm or more.

4. The display device according to claim 1, wherein the channel formation region comprises a crystalline component.

5. A display device comprising:
a plurality of pixels each comprising a transistor comprising an oxide semiconductor in a channel formation region,
wherein the oxide semiconductor comprises In, Ga and Zn,
wherein the display device is configured to change an interval between rewrites of image signals, and
wherein an off-current of the transistor is less than or equal to $1 \times 10^{-12}$ A when voltage between a drain and a source of the transistor is 10V.

6. The display device according to claim 5, wherein the display device is a liquid crystal display device.

7. The display device according to claim 5,
wherein each of the plurality of pixels comprises a liquid crystal element comprising a liquid crystal material whose specific resistance is $1 \times 10^{13}$ Ω·cm or more.

8. The display device according to claim 5, wherein the channel formation region comprises a crystalline component.

9. A driving method of a display device,
wherein the display device comprises a plurality of pixels each comprising a transistor comprising an oxide semiconductor in a channel formation region,
wherein the oxide semiconductor comprises In, Ga and Zn,
wherein an off-current of the transistor is less than or equal to $1 \times 10^{-12}$ A when voltage between a drain and a source of the transistor is 10V,
wherein the driving method comprises:
displaying a still image with a refresh rate less than 60 Hz.

10. The driving method according to claim 9, wherein the display device is a liquid crystal display device.

11. The driving method according to claim 9,
wherein each of the plurality of pixels comprises a liquid crystal element comprising a liquid crystal material whose specific resistance is $1 \times 10^{13}$ Ω·cm or more.

12. The driving method according to claim 9, wherein the channel formation region comprises a crystalline component.

* * * * *